(12) United States Patent
Fairbanks

(10) Patent No.: US 11,658,481 B1
(45) Date of Patent: *May 23, 2023

(54) SOURCE AND DRAIN ENABLED CONDUCTION TRIGGERS AND IMMUNITY TOLERANCE FOR INTEGRATED CIRCUITS

(71) Applicant: Amplexia, LLC, Durham, NC (US)

(72) Inventor: Stephen R. Fairbanks, Mesa, AZ (US)

(73) Assignee: Amplexia, LLC, Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/576,267

(22) Filed: Jan. 14, 2022

Related U.S. Application Data

(63) Continuation of application No. 16/883,431, filed on May 26, 2020, now Pat. No. 11,228,174.

(60) Provisional application No. 62/854,670, filed on May 30, 2019.

(51) Int. Cl.
*H02H 9/04* (2006.01)
*H01L 27/02* (2006.01)

(52) U.S. Cl.
CPC ......... *H02H 9/046* (2013.01); *H01L 27/0262* (2013.01); *H01L 27/0266* (2013.01)

(58) Field of Classification Search
CPC .. H02H 9/046; H01L 27/0262; H01L 27/0266
USPC .......................................................... 361/56
See application file for complete search history.

(56) References Cited

U.S. PATENT DOCUMENTS

| | | | |
|---|---|---|---|
| 3,906,540 | A | 9/1975 | Hollins |
| 4,362,597 | A | 12/1982 | Fraser et al. |
| 4,692,348 | A | 9/1987 | Rubloff et al. |
| 4,983,535 | A | 1/1991 | Blanchard |

(Continued)

FOREIGN PATENT DOCUMENTS

| | | |
|---|---|---|
| WO | 2017192432 A1 | 11/2017 |
| WO | 2018227086 A1 | 12/2018 |

OTHER PUBLICATIONS

Chen, Chi-Kuang, Huang, Chien-Fu, Chang, Yi-Feng, Lee, Jam-Wem, Cheng, Shui-Ming, Song, Ming-Hsiang, Schottky Emmitter High Holding Voltage ESD Clamp in BCD Power Technology, Aug. 2012, (6 pages).

(Continued)

*Primary Examiner* — Dharti H Patel
(74) *Attorney, Agent, or Firm* — Tillman, Wright & Wolgin; James D. Wright; Neal B. Wolgin

(57) ABSTRACT

Integrated circuits with enhanced EOS/ESD robustness and methods of designing same. One such integrated circuit includes a plurality of input/output pads, a positive voltage rail, a ground voltage rail, a collection of internal circuits representing the operational core of the integrated circuit, a plurality of input/output buffering circuits connected as inputs and outputs to the internal circuits, wherein the internal circuits and the input/output buffering circuits comprise functional devices, and a plurality of EOS/ESD protection circuits interconnected with the input/output pads to limit ESD voltage and/or shunt ESD current away from the functional devices. At least one of the EOS/ESD protection circuits is a MOSFET. The MOSFET has a source region having an accompanying ohmic contact. The MOSFET further has a rectifying junction contact in place of a drain region and accompanying ohmic contact.

17 Claims, 17 Drawing Sheets

(56) References Cited

U.S. PATENT DOCUMENTS

| | | | |
|---|---|---|---|
| 5,567,969 | A * | 10/1996 | Hall .................... H01L 27/0716 257/370 |
| 5,585,294 | A | 12/1996 | Smayling et al. |
| 5,629,544 | A | 5/1997 | Voldman et al. |
| 5,663,584 | A | 9/1997 | Welch |
| 5,808,340 | A | 9/1998 | Wollesen et al. |
| 5,811,857 | A | 9/1998 | Assaderaghi et al. |
| 5,960,271 | A | 9/1999 | Wollesen et al. |
| 6,015,993 | A | 1/2000 | Voldman et al. |
| 6,232,163 | B1 | 5/2001 | Voldman et al. |
| 6,252,278 | B1 | 6/2001 | Hsing |
| 6,303,479 | B1 | 10/2001 | Snyder |
| 6,339,005 | B1 | 1/2002 | Bryant et al. |
| 6,353,520 | B1 | 3/2002 | Andresen et al. |
| 6,495,882 | B2 | 12/2002 | Snyder |
| 6,686,233 | B2 | 2/2004 | Söderbärg et al. |
| 6,744,103 | B2 | 6/2004 | Snyder |
| 6,777,745 | B2 | 8/2004 | Hshieh et al. |
| 6,876,035 | B2 | 4/2005 | Abadeer et al. |
| 6,900,101 | B2 | 5/2005 | Lin |
| 6,958,515 | B2 | 10/2005 | Hower et al. |
| 7,052,941 | B2 | 5/2006 | Lee |
| 7,081,655 | B2 | 7/2006 | Maszara |
| 7,173,310 | B2 | 2/2007 | Voldman et al. |
| 7,176,537 | B2 | 2/2007 | Lee et al. |
| 7,221,019 | B2 | 5/2007 | Snyder et al. |
| 7,306,998 | B2 | 12/2007 | Maszara |
| 7,432,579 | B2 | 10/2008 | Matsudai et al. |
| 7,544,557 | B2 | 6/2009 | Levin et al. |
| 7,575,977 | B2 | 8/2009 | Levin et al. |
| 7,576,388 | B1 | 8/2009 | Wilson et al. |
| 7,745,846 | B2 | 6/2010 | Korec et al. |
| 7,851,889 | B2 | 12/2010 | Zhu et al. |
| 7,960,997 | B2 | 6/2011 | Williams |
| 8,058,167 | B2 | 11/2011 | Snyder et al. |
| 8,154,025 | B2 | 4/2012 | Snyder et al. |
| 8,508,015 | B2 | 8/2013 | Allen et al. |
| 8,889,537 | B2 | 11/2014 | Cabral, Jr. et al. |
| 9,337,329 | B2 | 5/2016 | Hu et al. |
| 9,425,304 | B2 | 8/2016 | Zhang et al. |
| 9,947,787 | B2 | 4/2018 | Dolny et al. |
| 10,090,409 | B2 | 10/2018 | McGregor et al. |
| 10,510,869 | B2 | 12/2019 | Dolny et al. |
| 10,892,362 | B1 | 1/2021 | Toner et al. |
| 11,024,733 | B2 | 6/2021 | Snyder |
| 11,228,174 | B1 * | 1/2022 | Fairbanks ............. H01L 27/027 |
| 11,322,611 | B2 | 5/2022 | Toner et al. |
| 2004/0027742 | A1 * | 2/2004 | Miller .................. H01L 27/0292 361/111 |
| 2004/0119103 | A1 | 6/2004 | Thapar |
| 2005/0035410 | A1 | 2/2005 | Yeo et al. |
| 2005/0098845 | A1 | 3/2005 | Matsudai et al. |
| 2007/0001223 | A1 | 1/2007 | Boyd et al. |
| 2008/0164537 | A1 | 7/2008 | Cai |
| 2009/0102007 | A1 | 4/2009 | Kocon |
| 2009/0230468 | A1 | 9/2009 | Cai |
| 2010/0059819 | A1 | 3/2010 | Snyder |
| 2010/0230751 | A1 | 9/2010 | Botula et al. |
| 2011/0049624 | A1 | 3/2011 | Guo et al. |
| 2011/0057230 | A1 | 3/2011 | Udrea et al. |
| 2012/0080728 | A1 | 4/2012 | Malhan |
| 2012/0139047 | A1 | 6/2012 | Luo et al. |
| 2012/0181586 | A1 | 7/2012 | Luo et al. |
| 2012/0193747 | A1 | 8/2012 | Rassel et al. |
| 2012/0211859 | A1 | 8/2012 | Stribley et al. |
| 2012/0220091 | A1 | 8/2012 | Challa et al. |
| 2013/0114170 | A1 * | 5/2013 | Chen .................... H02H 9/046 361/56 |
| 2013/0140625 | A1 | 6/2013 | Piao et al. |
| 2013/0277791 | A1 | 10/2013 | Nassar et al. |
| 2014/0357038 | A1 | 12/2014 | Shekar |
| 2015/0001620 | A1 | 1/2015 | McGregor et al. |
| 2015/0001666 | A1 | 1/2015 | Chiang |
| 2015/0084118 | A1 | 3/2015 | Van Brunt et al. |
| 2015/0187928 | A1 | 7/2015 | Wang et al. |
| 2015/0243501 | A1 | 8/2015 | Thomason et al. |
| 2016/0260831 | A1 | 9/2016 | Prasad et al. |
| 2017/0323970 | A1 | 11/2017 | Dolny et al. |
| 2017/0373180 | A1 | 12/2017 | Haeberlen et al. |
| 2018/0212041 | A1 | 7/2018 | Dolny et al. |
| 2018/0261495 | A1 | 9/2018 | Yang et al. |
| 2018/0286857 | A1 | 10/2018 | Wang et al. |
| 2018/0358352 | A1 | 12/2018 | Voldman et al. |
| 2019/0237457 | A1 | 8/2019 | Yamada et al. |
| 2019/0288063 | A1 | 9/2019 | Komatsu et al. |
| 2020/0220005 | A1 | 7/2020 | Huang |
| 2021/0028166 | A1 | 1/2021 | Shin |
| 2021/0118987 | A1 | 4/2021 | Yao et al. |
| 2021/0134954 | A1 | 5/2021 | Lin |
| 2021/0167190 | A1 | 6/2021 | Jin et al. |
| 2021/0280680 | A1 | 9/2021 | Xu |
| 2021/0359132 | A1 | 11/2021 | Mun et al. |

OTHER PUBLICATIONS

Jain, A. & Parthavi, U.M.; "Schottky Laterally Double Diffused Metal Oxide Semiconductor", Department of Electrical Engineering, Indian Institute of Technology, Delhi, Hauz Khas, New Delhi—110016, India, May 2010.

X. Kinoshita, C. Tanaka, K. Uchida and J. Koga, "High-performance 50-nm-Gate-Length Schottky-Source/Drain MOSFETs with Dopant-Segregation Junctions", Symposium on VLSI Technology Digest of Technical Papers, 2005, pp. 158-159.

X. Kinoshita, Y. Tsuchiya, A. Yagishita, K. Uchida and J. Koga, "Solution for High-Performance Schottky-Source/Drain MOSFETs: Schottky Barrier Height Engineering with Dopant Segregation Technique", Symposium on VLSI Technology Digest of Technical Papers, pp. 168-169, 2004.

Atsuhiro Kinoshita, "Dopant Segregated Schottky S/D and Application to High Performance MOSFETs", Ext. Abs. the th International Workshop on Junction Technology, 2009, pp. 34-37.

Atsuhiro Kinoshita, "Dopant-Segregated Source/Drain Technology for High-Performance CMOS", IEDM 2008.

T. Kinoshita, R. Hasumi, M. Hamaguchi, K. Miyashita, T. Komoda, A. Kinoshita, J. Koga, K. Adachi, Y. Toyoshima, T. Nakayama, S. Yamada and F. Matsuoka, "Ultra-Low Voltage Operations in Bulk CMOS Logic Circuits with Dopant Segregated Schottky Source/Drain Transistors", IEDM 2006.

Lee et al. "Schottky LDNMOS for HV ESD Protection". Globalfoundries Inc., (10 pages).

Lin, Chun-Yu, "Diode String With Reduced Clamping Voltage for Efficient On-Chip ESD Protection". IEEE Transaction an Device and Materials Reliability, vol. 16, No. 4 Dec. 2016, pp. 688-690, (3 pages).

Nishi, Yoshifumi, et al., "Schottky barrier height modulation by atomic dipoles at the silicide/silicon interface", Physical Review B 84, 115323 (2011), published Sep. 26, 2011, (6 pages).

Nishisaki et al. "Schottky SOI MOSFET with Shallow Doped-Extension" The Japan Society of Applied Physics, Japanese Journal of Applied Physics, vol. 42, Part 1 No. 4B, (2009).

U.S. Appl. No. 62/333,073, Dolny et. al., filed May 6, 2016, Drawings, Specification, Claims, Abstract.

Zhang et al., "Probing the Interface Barriers of Dopant-Segregated Silicide-Si Diodes With Internal Photoemission" IEEE Transactions of Electron Devices, vol. 59, No. 8, Aug. 2012, pp. 2027-2032, (6 pages).

Information Disclosure Statement (IDS) Letter Regarding Common Patent Application(s), dated Jan. 20, 2022.

* cited by examiner

260

280

SOURCE AND DRAIN ENABLED CONDUCTION TRIGGERS AND IMMUNITY TOLERANCE FOR INTEGRATED CIRCUITS

CROSS-REFERENCE TO RELATED APPLICATIONS

The present application is a continuation of and claims priority under 35 U.S.C. § 120 to U.S. patent application Ser. No. 16/883,431, filed May 26, 2020 (the "'431 application"), which issued Jan. 18, 2022 as U.S. Pat. No. 11,228,174, which '431 application is a non-provisional patent application of, and claims the benefit under 35 U.S.C § 119(e) to, U.S. Provisional Patent Application No. 62/854,670, filed May 30, 2019, the entirety of which is expressly incorporated herein by reference.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The disclosure relates generally to a structure and corresponding design methods of semiconductor integrated circuits using a semiconductor substrate, more particularly, to the formation of a Schottky rectifying junction during fabrication of the non-gate terminals (ie, source, drain, emitter, collector, anode and/or cathode) of the active devices of CMOS or BCD integrated circuits to improve the EOS/ESD robustness in functional circuits and improve the triggering in EOS/ESD protection circuits.

Background

Bipolar-CMOS-DMOS (BCD) is a semiconductor integrated circuit process using a semiconductor substrate, combining three different process technologies to form an integrated circuit: including bipolar junction transistors (NPN, PNP); Complementary Metal Oxide Semiconductor (CMOS); and Double-diffused Metal Oxide Semiconductor (DMOS) elements (e.g.—LDMOS). BCD or CMOS integrated circuits are typically implemented using a combination of active and passive devices. The most common active devices are diodes, bipolar junction transistors (BJTs), MOSFETs (NMOS, PMOS), and silicon-controlled rectifiers (SCRs). In the course of electrical operation, the active devices may encounter a disruptive event, such as a current spike and/or voltage overshoot. These disruptive events are referred to as electrical overstress and/or electrostatic discharge (EOS/ESD). Conventionally, the internal circuits (i.e., the "core") of an integrated circuit are protected against such events using specialized circuit devices. In this regard, FIG. 1 is an exemplary high level logical block diagram of a BCD or CMOS integrated circuit (IC) 10. The IC 10 includes input/output pads 16, EOS/ESD protection circuits 20, including an SCR 50 used as a power rail ESD clamp, input/output buffering circuits 30, and internal circuits 40.

The power rail ESD clamp 50 is connected between a positive voltage rail VDD 12 and a ground voltage rail Vss 14.

EOS/ESD protection circuits 20 may include or incorporate a variety of devices. In this regard, FIG. 2 is a generic circuit diagram illustrating various types of EOS/ESD protection circuits 20. Exemplary protection circuits may include a variety of diodes 22, a variety of BJTs 24,25, a variety of MOSFETS 26,28, and/or a variety of SCRs 50. These protection circuits 20 are designed to limit the ESD voltage and shunt the ESD current away from the I/O buffering circuits 30, preventing damage to the buffering circuits 30 and/or the internal circuits 40.

The input/output buffering circuits 30 may likewise include or incorporate a variety of devices. In this regard, FIG. 3 is a generic circuit diagram illustrating various types of input/output buffering circuits 30. These exemplary buffering circuits 30 are generally located between the protection circuits 20 and the core internal circuits 40 of an IC 10. Buffering circuits 30 may include a variety of BJTs 34,35, a variety of MOSFETS 36,38, and/or a variety of SCRs 31. Due to their proximity to the exterior of the IC 10, these devices may be exposed to levels of current and voltage and/or spikes in current and voltage above the levels generally considered to part of the normal operating region. As noted above, the EOS/ESD protection circuits 20 are designed to prevent these higher levels of current and voltage and/or spikes in each from damaging the buffering circuits 30.

FIG. 4 is a generic circuit diagram illustrating various types of internal circuits 40 found in the core of a CMOS IC 10. The internal circuits 40 represent the functional operation area of the CMOS IC 10 and may include BJTs 44,45, MOSFETS 46,48, and SCRs 41 interconnected by local electrical nets 401,402,404,406,408.

Semiconductor reliability has been a primary industry focus for decades. One such factor of reliability is related to Electrical Overstress (EOS) and Electrostatic Discharge (ESD). Both EOS and ESD can induce high voltage fields and high current densities that damage electrical circuits by either inducing a field breakdown of an insulator or dielectric, or causing thermal damage in the integrated semiconductor circuit. EOS/ESD related failures have becoming increasingly more problematic in part because scaling to smaller channel lengths and smaller features complicates EOS/ESD protection by narrowing the design margin, which is commonly defined as the difference between normal operating voltage and current levels, and destructive voltages and current levels, causing circuit failure. The most common method for widening this design margin is to add circuit features that are able to handle the EOS/ESD currents and/or limit the voltages.

When an integrated semiconductor circuit experiences an EOS/ESD voltage, many different mechanisms will trigger and can cause failure. The most common thermal failures are related to avalanche breakdown, and the most common dielectric failures are Gate-Oxide breakdown. Avalanche breakdown is generally characterized by a spike in current, across a reversed biased p-n junction in a semiconductor, as voltage is increased across that junction. It needs to be noted that avalanche breakdown itself may not be destructive immediately, and in fact once a p-n junction begins to avalanche, many ESD circuits and protection strategies will use that avalanching current to help trigger ESD protection and extend the EOS/ESD design margin. These junctions, while often used to triggered ESD protection structures, can only avalanche under an overstress voltage and overstress current densities, for a limited amount of time and/or peak overstress magnitudes before failing themselves.

The gate-oxide breakdown voltage is a voltage that results in failure of a MOSFET gate, causing a direct path through the gate-oxide between two electrical terminals of the MOSFET, generally the gate and one or more of three terminals, the source, drain or bulk. Gate-oxide breakdown is dependent on not only the peak magnitude of overstress voltage, but also the time over which the voltage is applied. Higher overstress voltages will cause gate-oxide breakdown more quickly than lower overstress voltages. Unlike avalanching junctions, the gate-oxide fails almost immediately once breakdown begins. Traditionally, avalanche breakdown is used to trigger ESD protection strategies that then clamp the voltages, and absorb the current densities, to prevent gate-oxide breakdown. As the designs are scaled to smaller channel lengths, the voltage which may cause a gate-oxide breakdown, and thus failure of the I/O buffering circuits 30 and/or internal circuits 40, is approaching the voltage that is required to trigger many ESD protection strategies, using avalanche breakdown. Thus, these circuits 30,40 (sometimes referred to as "functional" devices) are at risk of failure before an EOS/ESD protection device 20 is triggered to protect against failure.

As EOS/ESD protection has become more complicated to compensate for the narrowing design margins, so have many of the protection devices 20, which can in turn create further reliability issues on the CMOS IC 10. In practice, EOS/ESD protection 20 devices are additional structures added between the Input/Output pads 16 and the buffering circuits 30 resulting in more die area (higher cost). This also raises the parasitic capacitance and resistance of the signals on the IC device 10, thus degrading performance of the functional circuits 30,40 of the IC 10. Also, the MOSFET structures of standard I/O buffering circuits 30 contain an inherent, parasitic bipolar junction transistor that is susceptible to latch-up. To avoid confusion with an intentionally designed BJT 24,25,34,35,44,45, these parasitic devices are referred to hereinafter as "parasitic p-n-p/n-p-n transistors." In most CMOS processes, the parasitic p-n-p/n-p-n transistors in the ESD protection devices 20 are equivalent to those in the functional I/O MOSFET's 36,38, creating conditions in which it is hard to know which parasitic p-n-p/n-p-n transistors will trigger (in the case of the ESD devices 20) or fail (in the case of the functional devices 30,40) first. In the case where the I/O buffering circuit is itself designed to be the ESD protection element, it is referred to as a self-protected Buffer or I/O. In such cases it is treated as both the I/O Buffer circuit and the ESD protection circuit.

EOS/ESD protection strategies include the use of dedicated ESD devices and process steps to both improve the EOS/ESD protection performance of ESD devices as well as improve the EOS/ESD immunity of non-ESD devices. Unfortunately, most of these dedicated ESD devices and process modifications for ESD and non-ESD devices increase die-size and add cost to the fabrication process. Thus, a need exists for the ability to control and adjust certain electrical characteristics of the parasitic p-n-p/n-p-n transistors in CMOS MOSFET devices, so the MOSFET device is protected during an EOS/ESD event without adding to the size of the device, complexity of the fabrication process, or raising parasitic capacitance and/or resistance of the device. A need also exists to control and adjust certain electrical characteristics of intentionally designed BJTs. This ability is needed to both improve the EOS/ESD immunity of the functional, non-ESD devices 30,40 shown in greater detail in FIGS. 3 and 4, as well as improve the triggering robustness of the EOS/ESD protection devices 20 shown in FIG. 2.

SUMMARY OF THE PRESENT INVENTION

Broadly defined, the present invention according to one aspect relates to an integrated circuit with enhanced EOS/ESD robustness, including: a plurality of input/output pads; a positive voltage rail; a ground voltage rail; a collection of internal circuits representing the operational core of the integrated circuit; a plurality of input/output buffering circuits connected as inputs and outputs to the internal circuits, wherein the internal circuits and the input/output buffering circuits comprise functional devices; and a plurality of EOS/ESD protection circuits interconnected with the input/output pads to limit ESD voltage and/or shunt ESD current away from the functional devices; wherein at least one of the EOS/ESD protection circuits is a MOSFET, wherein the MOSFET has a source region having an accompanying ohmic contact, and wherein the MOSFET further has a rectifying junction contact in place of a drain region and accompanying ohmic contact.

In a feature of this aspect, the at least one EOS/ESD protection circuit has a first I-V characterization curve having a first snapback voltage, wherein at least one of the functional devices has a second I-V characterization curve having a second snapback voltage, and wherein the rectifying junction contact in the at least one EOS/ESD protection circuit causes the first snapback voltage to be less than the second snapback voltage.

In another feature of this aspect, the MOSFET is a PMOS device.

In another feature of this aspect, the MOSFET is an NMOS device.

Broadly defined, the present invention according to another aspect relates to an integrated circuit with enhanced EOS/ESD robustness, including: a plurality of input/output pads; a positive voltage rail; a ground voltage rail; a collection of internal circuits representing the operational core of the integrated circuit; a plurality of input/output buffering circuits connected as inputs and outputs to the internal circuits, wherein the internal circuits and the input/output buffering circuits comprise functional devices; and a plurality of EOS/ESD protection circuits interconnected with the input/output pads to limit ESD voltage and/or shunt ESD current away from the functional devices; wherein at least one of the EOS/ESD protection circuits is a bipolar junction transistor (BJT), wherein the BJT has an emitter region having an accompanying ohmic contact, and wherein the BJT further has a rectifying junction contact in place of a collector region and accompanying ohmic contact.

In a feature of this aspect, the at least one EOS/ESD protection circuit has a first I-V characterization curve having a first snapback voltage, wherein at least one of the functional devices has a second I-V characterization curve having a second snapback voltage, and wherein the rectifying junction contact in the at least one EOS/ESD protection circuit causes the first snapback voltage to be less than the second snapback voltage.

Broadly defined, the present invention according to another aspect relates to an integrated circuit with enhanced EOS/ESD robustness, including: a plurality of input/output pads; a positive voltage rail; a ground voltage rail; a collection of internal circuits representing the operational core of the integrated circuit; a plurality of input/output buffering circuits connected as inputs and outputs to the internal circuits, wherein the internal circuits and the input/output buffering circuits comprise functional devices; and a plurality of EOS/ESD protection circuits interconnected with the input/output pads to limit ESD voltage and/or shunt ESD current away from the functional devices; wherein at least one of the functional devices includes a MOSFET, wherein the MOSFET has a drain region having an accompanying ohmic contact, and wherein the MOSFET further has a rectifying junction contact in place of a source region and accompanying ohmic contact.

In a feature of this aspect, the MOSFET is a PMOS device.

In another feature of this aspect, the MOSFET is an NMOS device.

In another feature of this aspect, the at least one functional device is an internal circuit.

In another feature of this aspect, the at least one functional device is an input/output buffering circuit.

In another feature of this aspect, the at least one functional device has a first I-V characterization curve having a first snapback current, wherein at least one of the EOS/ESD protection circuits has a second I-V characterization curve having a second snapback current, and wherein the rectifying junction contact in the at least one functional device causes the first snapback current to be greater than the second snapback current.

Broadly defined, the present invention according to another aspect relates to an integrated circuit with enhanced EOS/ESD robustness, including: a plurality of input/output pads; a positive voltage rail; a ground voltage rail; a collection of internal circuits representing the operational core of the integrated circuit; a plurality of input/output buffering circuits connected as inputs and outputs to the internal circuits, wherein the internal circuits and the input/output buffering circuits comprise functional devices; and a plurality of EOS/ESD protection circuits interconnected with the input/output pads to limit ESD voltage and/or shunt ESD current away from the functional devices; wherein at least one of the functional devices includes a bipolar junction transistor (BJT), wherein the BJT has a collector region having an accompanying ohmic contact, and wherein the BJT further has a rectifying junction contact in place of an emitter region and accompanying ohmic contact.

In a feature of this aspect, the at least one functional device is an internal circuit.

In another feature of this aspect, the at least one functional device is an input/output buffering circuit.

In another feature of this aspect, the at least one functional device has a first I-V characterization curve having a first snapback current, wherein at least one of the EOS/ESD protection circuits has a second I-V characterization curve having a second snapback current, and wherein the rectifying junction contact in the at least one functional device causes the first snapback current to be greater than the second snapback current.

Broadly defined, the present invention according to another aspect relates to a method of designing an integrated circuit with enhanced EOS/ESD robustness, including the steps of: designing a plurality of input/output pads in the integrated circuit; designing a positive voltage rail in the integrated circuit; designing a ground voltage rail in the integrated circuit; designing a collection of internal circuits, in the integrated circuit, representing the operational core of the integrated circuit in the integrated circuit; designing a plurality of input/output buffering circuits, in the integrated circuit, connected as inputs and outputs to the internal circuits, wherein the internal circuits and the input/output buffering circuits comprise functional devices; and designing a plurality of EOS/ESD protection circuits, in the integrated circuit, interconnected with the input/output pads to limit ESD voltage and/or shunt ESD current away from the functional devices, wherein at least one of the EOS/ESD protection circuits is a MOSFET; wherein designing the MOSFET includes designing a source region of the MOSFET to have an accompanying ohmic contact and designing the MOSFET to have a rectifying junction contact in place of a drain region and accompanying ohmic contact of the MOSFET.

In a feature of this aspect, the at least one EOS/ESD protection circuit has a first I-V characterization curve having a first snapback voltage, wherein at least one of the functional devices has a second I-V characterization curve having a second snapback voltage, and wherein the rectifying junction contact in the at least one EOS/ESD protection circuit causes the first snapback voltage to be less than the second snapback voltage.

In another feature of this aspect, the MOSFET is a PMOS device.

In another feature of this aspect, the MOSFET is an NMOS device.

In another feature of this aspect, the method further includes a step of determining an amount of space, in the floor plan of the integrated circuit, required by the plurality of EOS/ESD protection circuits, wherein the step of designing the MOSFET is carried out to replace a MOSFET having a drain region and accompanying ohmic contact, and wherein the replacement of the MOSFET having a drain region and accompanying ohmic contact with a MOSFET having a rectifying junction contact is carried out to decrease the amount of space, in the floor plan of the integrated circuit, required by the plurality of EOS/ESD protection circuits.

Broadly defined, the present invention according to another aspect relates to a method of designing an integrated circuit with enhanced EOS/ESD robustness, including the steps of: designing a plurality of input/output pads in the integrated circuit; designing a positive voltage rail in the integrated circuit; designing a ground voltage rail in the integrated circuit; designing a collection of internal circuits, in the integrated circuit, representing the operational core of the integrated circuit; designing a plurality of input/output buffering circuits, in the integrated circuit, connected as inputs and outputs to the internal circuits, wherein the internal circuits and the input/output buffering circuits comprise functional devices; and designing a plurality of EOS/ESD protection circuits, in the integrated circuit, interconnected with the input/output pads to limit ESD voltage and/or shunt ESD current away from the functional devices, wherein at least one of the EOS/ESD protection circuits is a bipolar junction transistor (BJT); wherein designing the BJT includes designing an emitter region of the BJT to have an accompanying ohmic contact and designing the BJT to have a rectifying junction contact in place of a collector region and accompanying ohmic contact.

In a feature of this aspect, the at least one EOS/ESD protection circuit has a first I-V characterization curve having a first snapback voltage, wherein at least one of the functional devices has a second I-V characterization curve having a second snapback voltage, and wherein the rectifying junction contact in the at least one EOS/ESD protection circuit causes the first snapback voltage to be less than the second snapback voltage.

In another feature of this aspect, the method further includes a step of determining an amount of space, in the floor plan of the integrated circuit, required by the plurality of EOS/ESD protection circuits, wherein the step of designing the BJT is carried out to replace a BJT having a collector region and accompanying ohmic contact, and wherein the replacement of the BJT having a collector region and accompanying ohmic contact with a BJT having a rectifying junction contact is carried out to decrease the amount of space, in the floor plan of the integrated circuit, required by the plurality of EOS/ESD protection circuits.

Broadly defined, the present invention according to another aspect relates to a method of designing an integrated circuit with enhanced EOS/ESD robustness, including the steps of: designing a plurality of input/output pads in the integrated circuit; designing a positive voltage rail in the integrated circuit; designing a ground voltage rail in the integrated circuit; designing a collection of internal circuits, in the integrated circuit, representing the operational core of the integrated circuit; designing a plurality of input/output buffering circuits, in the integrated circuit, connected as inputs and outputs to the internal circuits, wherein the internal circuits and the input/output buffering circuits comprise functional devices, and wherein at least one of the functional devices is a MOSFET; and designing a plurality of EOS/ESD protection circuits, in the integrated circuit, interconnected with the input/output pads to limit ESD voltage and/or shunt ESD current away from the functional devices; wherein designing the MOSFET includes designing a drain region of the MOSFET to have an accompanying ohmic contact and designing the MOSFET to have a rectifying junction contact in place of a source region and accompanying ohmic contact of the MOSFET.

In a feature of this aspect, the MOSFET is a PMOS device.

In another feature of this aspect, the MOSFET is an NMOS device.

In another feature of this aspect, the at least one functional device is an internal circuit.

In another feature of this aspect, the at least one functional device is an input/output buffering circuit.

In another feature of this aspect, the at least one functional device has a first I-V characterization curve having a first snapback current, wherein at least one of the EOS/ESD protection circuits has a second I-V characterization curve having a second snapback current, and wherein the rectifying junction contact in the at least one functional device causes the first snapback current to be greater than the second snapback current.

In another feature of this aspect, the method further includes a step of determining an amount of space, in the floor plan of the integrated circuit, required by the plurality of EOS/ESD protection circuits, wherein the step of designing the MOSFET is carried out to replace a MOSFET having a source region and accompanying ohmic contact, and wherein the replacement of the MOSFET having a source region and accompanying ohmic contact with a MOSFET having a rectifying junction contact is carried out to avoid adding a further EOS/ESD protection circuit, thereby avoiding an increase in the amount of space, in the floor plan of the integrated circuit, required by the plurality of EOS/ESD protection circuits.

In another feature of this aspect, the method further includes a step of designing a plurality of self-protected input/output buffering circuits, in the integrated circuit, connected as inputs and outputs to the internal circuits, that can also function as the EOS/ESD protection circuits.

Broadly defined, the present invention according to another aspect relates to a method of designing an integrated circuit with enhanced EOS/ESD robustness, including the steps of: designing a plurality of input/output pads in the integrated circuit; designing a positive voltage rail in the integrated circuit; designing a ground voltage rail in the integrated circuit; designing a collection of internal circuits, in the integrated circuit, representing the operational core of the integrated circuit; designing a plurality of input/output buffering circuits, in the integrated circuit, connected as inputs and outputs to the internal circuits, wherein the internal circuits and the input/output buffering circuits comprise functional devices, and wherein at least one of the functional devices includes a bipolar junction transistor (BJT); and designing a plurality of EOS/ESD protection circuits, in the integrated circuit, interconnected with the input/output pads to limit ESD voltage and/or shunt ESD current away from the functional devices; wherein designing the BJT includes designing a collector region of the BJT to have an accompanying ohmic contact and designing the BJT to have a rectifying junction contact in place of an emitter region and accompanying ohmic contact.

In a feature of this aspect, the at least one functional device is an internal logic circuit.

In another feature of this aspect, the at least one functional device is an input/output buffering circuit.

In another feature of this aspect, the at least one functional device has a first I-V characterization curve having a first snapback current, wherein at least one of the EOS/ESD protection circuits has a second I-V characterization curve having a second snapback current, and wherein the rectifying junction contact in the at least one functional device causes the first snapback current to be greater than the second snapback current.

In another feature of this aspect, the method further includes a step of determining an amount of space, in the floor plan of the integrated circuit, required by the plurality of EOS/ESD protection circuits, wherein the step of designing the BJT is carried out to replace a BJT having an emitter region and accompanying ohmic contact, and wherein the replacement of the BJT having an emitter region and accompanying ohmic contact with a BJT having a rectifying junction contact is carried out to avoid adding a further EOS/ESD protection circuit, thereby avoiding an increase in the amount of space, in the floor plan of the integrated circuit, required by the plurality of EOS/ESD protection circuits.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
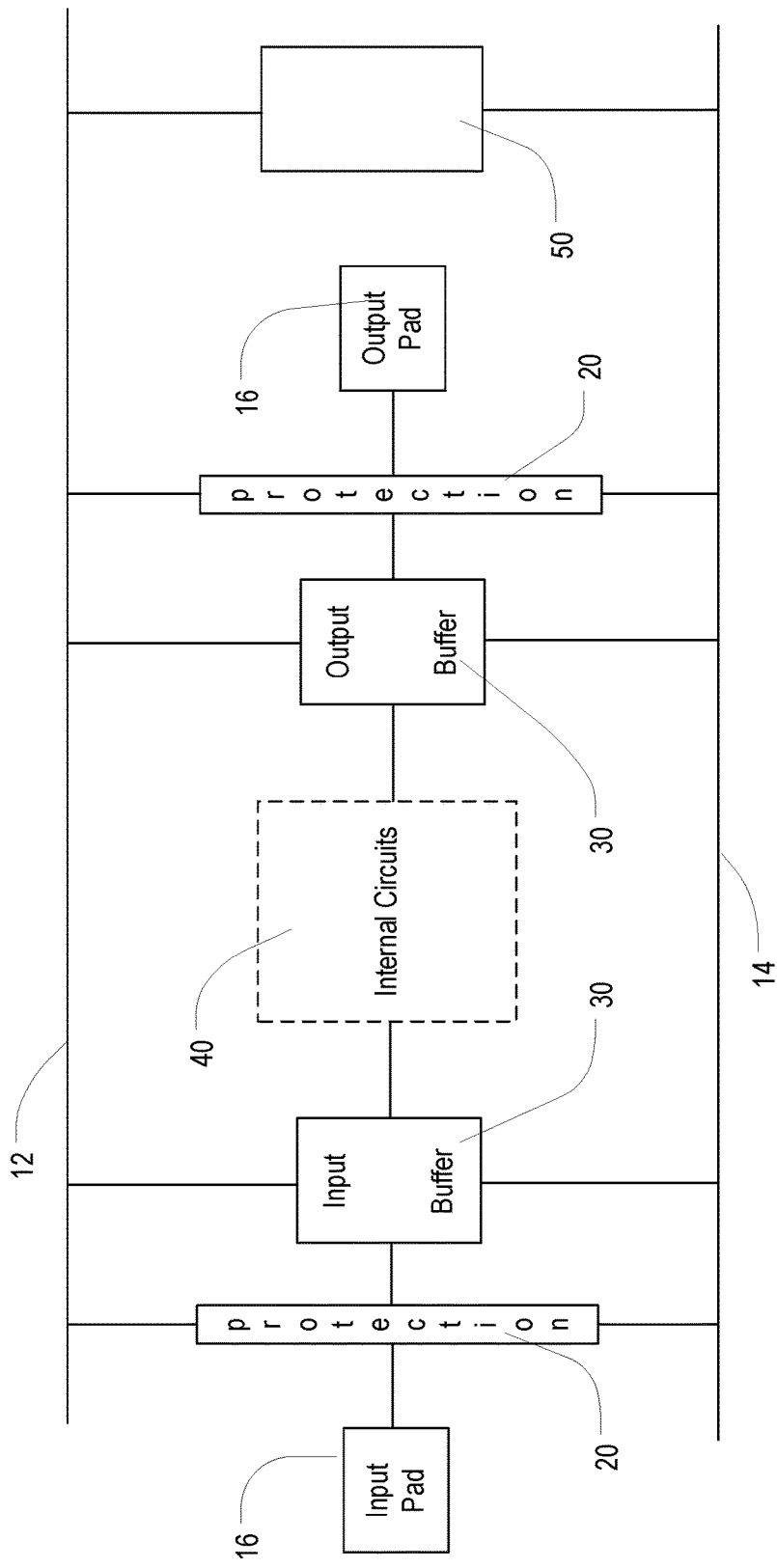
FIG. 1 is an exemplary high level logical block diagram of a BCD or CMOS integrated circuit (IC)

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

In accordance with various preferred embodiments of the present invention, circuit devices are provided with robust protection from a variety of EOS/ESD conditions at different stages of manufacturing/assembly and during normal circuit operation, while minimizing the area required by the protection circuit, through the use of a rectifying junction contact in the appropriate location in such devices. In protection circuits 20, inclusion of a rectifying junction contact at the anode region of a diode 22, at the bipolar collection region of a BJT 24,25, or at the drain-to-substrate region of a variety of MOSFETS 26,28 improves the EOS/ESD conduction of the device protecting the standard I/O buffering circuits 30. In I/O buffering circuits 30, inclusion of a rectifying junction contact at the bipolar emitter region of a BJT 34,35 or at the source-to-substrate region of a variety of MOSFETS 36,38 improves the EOS/ESD immunity and overvoltage tolerance of these functional I/O buffering devices. Because these effects are achieved by replacing conventional protection circuits 20 and I/O buffering circuits 30 with corresponding devices having a rectifying junction contact included in place of a conventional terminal region, a designer can easily improve the EOS/ESD conduction in "conducting" devices, or improve EOS/ESD immunity and overvoltage tolerance in "tolerating devices," while maintaining the same device count and die size.

Explanation of Rectifying Junction Contacts

A rectifying junction contact can be formed from a variety of techniques, including pure metal deposition, silicide deposition including deposition and annealing, dopant segregation or novel contact techniques. As used herein, a rectifying junction contact is intended to mean a conducting layer (e.g., metal, pure metal, metal alloy, pure metal alloy, silicide, and other conducting materials) formed on a semiconductor substrate to define a "rectifying barrier junction" between the conducting layer and the semiconductor substrate. A rectifying junction contact is defined as a rectifying barrier junction between a metal conducting layer and a semiconductor substrate (sometimes referred to as a "Schottky contact"), or between a non-metal and metal conducting layer and a semiconductor substrate (sometimes referred to as a "Schottky-like contact") where the band structure, including the barrier height, of the junction can be modulated. As used herein, modulation refers to a technique that modifies the band structure (e.g., barrier height, shape, profile steepness, electrical conductivity, etc.) between the conducting layer and the semiconductor substrate, such as by specifying the conducting layer material (e.g., metal, metal alloy, silicide, and other conducting materials), dopant segregation, other techniques described herein, and/or other techniques known to one of ordinary skill in the art. As used herein, a non-metal and metal conducting layer refers to a conducting layer that includes metal elements and non-metal elements.

In some preferred embodiments, the non-metal and metal conducting layer is a metal silicide conducting layer, resulting in an interfacial dopant segregation layer and corresponding depletion region. The design margin between the functional circuit and the protection circuit can be improved by having a rectifying junction contact at the source and/or drain of the MOSFET device or the collector and/or emitter of a strict bipolar device. Since n-type protection device embodiments of the invention do not include an n+ region for the drain, the parasitic n-p-n transistor and its associated undesirable effects are significantly reduced or eliminated. Similarly, since p-type protection device embodiments of the invention do not include a p+ region for the drain, the parasitic p-n-p transistor and its associated undesirable effects are significantly reduced or eliminated. Correspondingly, n-type functional circuit device embodiments of the invention do not include an n+ region for the source, thus the parasitic n-p-n transistor and its associated undesirable effects are significantly reduced or eliminated. Similarly, since p-type protection device embodiments of the invention do not include a p+ region for the source, the parasitic p-n-p transistor and its associated undesirable effects are significantly reduced or eliminated.

The embodiments of the invention also include the explicit bipolar case, where instead of affecting the parasitic n-p-n or p-n-p of a MOSFET, we are directly addressing a collector and/or emitter of an explicit n-p-n or p-n-p bipolar device. Having a rectifying junction contact on the source lowers the current gain at the base-to-emitter (often referred to as the "beta") of the parasitic bipolar transistor (n-p-n for n-type devices and p-n-p for p-type devices), increasing the immunity to snapback and enabling the functional device to tolerate a higher trigger current and/or overstress voltage. Having a rectifying junction contact on the drain lowers the breakdown voltage of the collector-to-emitter of the parasitic bipolar transistor, lowering the avalanche trigger point and enabling the protection circuit to conduct the overstress current. Applying the rectifying junction contact to the collector and/or emitter of an explicit bipolar n-p-n or p-n-p, and not the parasitic bipolar of a MOSFET, is also implied. A rectifying junction contact applied to the collector can either enable a functional bipolar to tolerate a higher trigger current and/or overstress voltage, just as applying the rectifying junction contact to the emitter lowers the breakdown voltage of the collector-to-emitter of the bipolar transistor, lowering the avalanche trigger point and enabling the protection circuit to conduct the overstress current.

By way of example and not limitation, the rectifying junction contact may, in at least some embodiments, be formed using the so-called Silicidation-Induced Dopant Segregation (SIDS) or Silicide As Diffusion Source (SADS) techniques. The resulting rectifying junction contact can be regarded as a first and second film, where the first film is a silicide film (metal conducting layer), and a second film which is an interfacial dopant segregation layer (non-metal conducting layer). The rectifying junction contact is formed substantially near the surface of said substrate comprising a silicide layer and an interfacial dopant segregation layer, wherein said interfacial dopant segregation layer provides electrical coupling to the gate and channel region, at either the source-to-channel region or drain-to-channel region. The anneal has the dual effect of generating the desired silicide stoichiometry as well as redistributing the dopant ahead of the silicide/silicon interface to form a very thin interface region at the edge of the source/drain silicide. As the refractory metal consumes the silicon atoms during silicidation, the implant dopants are redistributed, resulting in a steeper, modified impurity profile than that seen in conventional diffused profiles. This highly-doped region of impurities is used to modulate the band structure between the amorphous silicide and the single-crystal silicon. The band structure can be modulated via anneal parameters (e.g., anneal temperature and anneal time) or dopant segregation implant parameters (e.g., dopant segregation implantation dose and dopant segregation energy). It is desirable to modify the band structure to be similar to a p-n junction in order to maintain adequate I-V characteristics, while simultaneously reducing the beta of the parasitic bipolar transistor enough to modify the snapback point, which provides protection from EOS/ESD events.

For an n-type device such as the NMOS device 660 described below with reference to FIGS. 7A and 8A, and device 760 with reference to FIGS. 12A and 13A, before a drain (device 660) or a source (device 760) silicide is formed, the silicon surface is implanted (dopant segregation implant) with arsenic or phosphorus, at a dose, for example, of $10^{15}$ cm$^{-3}$. For a p-type device such as the PMOS device 680 described below with reference to FIGS. 7B and 8B, and device 780 with reference to FIGS. 12B and 13B, before a source (device 780) or drain (device 680) silicide is formed, the silicon surface is implanted (dopant segregation implant) with boron or boron diflouride. Immediately following the implant, without annealing, the silicide metal is deposited using, for example Co, Ni, Ni/Pt, Pd, Pt, Ta, TaN, Ti, TiN or W. Silicide formation takes place via a following anneal, a single-step anneal or a multi-step anneal involving both formation and conversion steps.

To achieve similar triggering and/or tolerating results in BJT devices, a similar process is followed. For an npn-type BJT device such as devices 25,35,45, the collector (device 25) or emitter (device 35,45) may be formed with an n-type implant, which in some embodiments is arsenic or phosphorus. For a pnp-type BJT device such as devices 24,34,44, the collector (device 24) or emitter (device 34,44) may be formed with a p-type implant, which in some embodiments is born or boron difluoride. Immediately following the implant, without annealing, the silicide metal is deposited using, for example Co, Ni, Ni/Pt, Pd, Pt, Ta, TaN, Ti, TiN or W. Silicide formation takes place via a following anneal, a single-step anneal or a multi-step anneal involving both formation and conversion steps.

Another technique for forming the rectifying junction contact is to use an appropriately-valued work function metal or metal alloy, without requiring the use of a SIDS or SADS technique. In either case, the rectifying junction contact is formed substantially near the surface of the substrate with a Schottky rectifying barrier junction at the source-to-channel region or the drain-to-channel region, which is normally a p-n junction interface. The Schottky rectifying barrier junction is a key mechanism in significantly reducing or eliminating the beta of the parasitic n-p-n or p-n-p of the MOSFET. A p-n rectifying junction interface is normally found at the source-to-channel region and drain-to-channel region in MOSFETs; at the collector, emitter, and base of BJTs; and at the anode and cathode of diodes.

Experimental results also demonstrate that the band structure of the rectifying barrier junction can be modulated by the anneal temperatures in the temperature ranges of 400 to 800 degrees C. The band structure can also be modulated by the dopant segregation implantation dose/energy. The depletion region of the rectifying barrier junction may extend past the dopant segregation layer to under the gate to allow for electrical coupling and reduced series resistance. The electrical coupling can be modulated by the spacer structure, dopant segregation implantation dose/energy, and thermal anneals.

Improved EOS/ESD Triggering in Protection Devices

By way of non-limiting illustration, it has been found that significantly improved ESD/EOS triggering results in conventional NMOS and PMOS devices may be achieved by replacing an ohmic contact and accompanying drain region with a rectifying junction contact. By way of introduction, FIGS. 5A and 5B are schematic diagrams illustrating a cross-section of an exemplary conventional NMOS device 260 and a cross-section of an exemplary conventional PMOS device 280, respectively, fabricated in a single well CMOS process. MOSFET devices, including the devices 260,280 of FIGS. 5A and 5B and variations thereof, are used as EOS/ESD MOSFET devices 26,28 and as non-ESD or functional MOSFET devices 36,38,46,48 in the CMOS IC 10 of FIGS. 1-4. The exemplary devices 260,280 of FIGS. 5A and 5B are both built on a p-substrate 295. With reference to FIG. 5A, the NMOS device 260 includes an n+ source region 262, an n+ drain region 264, a gate structure 266, and an p-substrate contact region 292. A respective ohmic contact 294,296,298 is located on each of the source region 262, the drain region 264, and the p-substrate contact region 292. The ohmic contacts 294,296,298 are used to connect each of these regions to metal interconnect of the circuit. With reference to FIG. 5B, the PMOS device 280 includes a p+ source region 282 and a p+ drain region 284 located in an n-well region 290 (single well region), a gate structure 286, and an n-well contact region 293 (also disposed in the n-well region 290). A respective ohmic contact 294,296,298 is located on each of the source region 282, the drain region 284, and the n-well contact region 293. The ohmic contacts 294,296,298 are used to connect each of these regions to the metal interconnect of the circuit. These exemplary MOSFET devices 260,280 show a basic single well fabrication process cross-section for all CMOS MOSFETS. However, as is well known by those in the semiconductor industry, MOSFET devices may also be fabricated using other standard CMOS fabrication processes. For example, a dual well process could be used where both n-well and p-well exist.

Figures 7A, 8A:
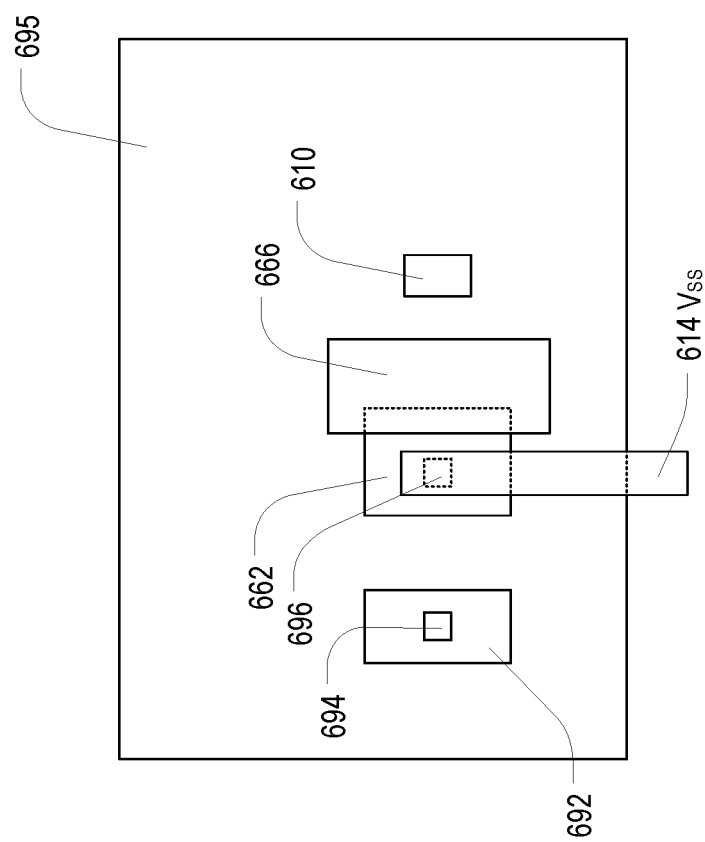
FIG. 7A is a cross-section of an exemplary EOS/ESD NMOS structure where a rectifying junction contact replaces both the n+ drain region and the ohmic contact on the n+ drain region in accordance with one or more preferred embodiments of the present invention.
FIG. 8A is a top view of the exemplary EOS/ESD NMOS structure of FIG. 7A.

By comparison, FIG. 7A is a cross-section of an exemplary EOS/ESD NMOS structure 660 where a rectifying junction contact 610 replaces both the n+ drain region 264 and the ohmic contact 298 on the n+ drain region, while FIG. 8A is a top view of the exemplary EOS/ESD NMOS structure 660 of FIG. 7A, all in accordance with one or more preferred embodiments of the present invention. Similarly, FIG. 7B is a cross-section of an exemplary EOS/ESD PMOS structure 680 where a rectifying junction contact 610 replaces both the p+ drain region 284 and the ohmic contact 298, while FIG. 8B is a top view of the exemplary EOS/ESD PMOS structure 680 of FIG. 7B, all in accordance with one or more preferred embodiments of the present invention.

With reference to FIGS. 5A, 7A, and 8A, the NMOS structure 660 is fabricated in a single-well CMOS process built on a p-substrate 695. The structure 660 further includes a rectifying junction contact 610, an n+ source region 662, a gate structure 666, and a p-substrate contact region 692. A respective ohmic contact 694,696 is located on each of the source region 662 and the p-substrate contact region 692. The rectifying junction contact 610 is utilized in place of the standard n+ implant drain 264 and ohmic contact 298 shown in FIG. 5A. Metallization layers and interlayer dielectric (ILD) are placed on the wafer surface, and the ohmic contacts 694,696 are used to connect the source region 662 to metal interconnect 614 and the p-substrate contact region 692 to metal interconnect of the circuit. The rectifying junction contact 610 both acts as the drain side of the NMOS structure 660 and connects the drain side to the metal interconnect of the circuit.

Figure 8B:
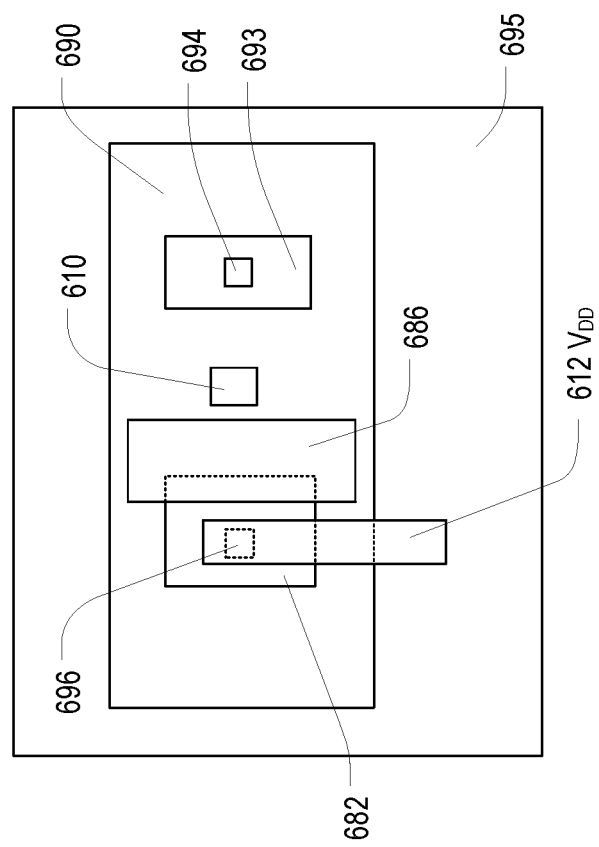
FIG. 8B is a top view of the exemplary EOS/ESD PMOS structure of FIG. 7B.
Figure 7B:
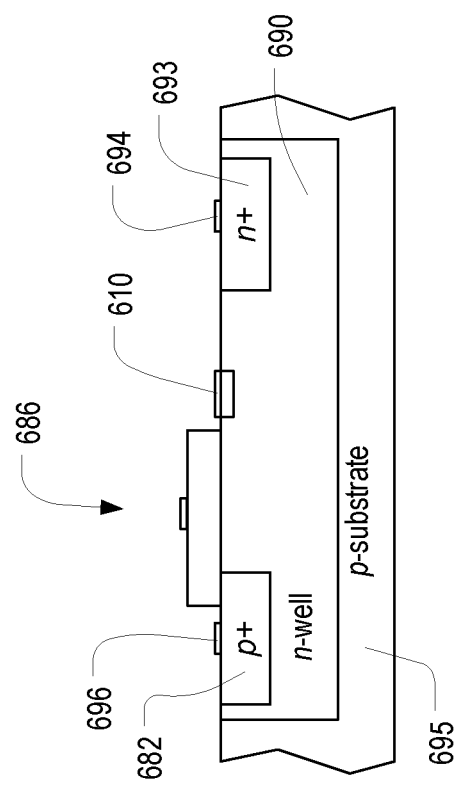
FIG. 7B is a cross-section of an exemplary EOS/ESD PMOS structure where a rectifying junction contact replaces both the p+ drain region and the ohmic contact in accordance with one or more preferred embodiments of the present invention.

With reference to FIGS. 5B, 7B, and 8B, the PMOS structure 680 is also fabricated in a single well CMOS process built on a p-substrate 695. The structure 680 further includes a p+ source region 682 and a rectifying junction contact 610 located in an n-well region 690 (single well region), a gate structure 686, and an n-well contact region 693 (also disposed in the n-well region 690). A respective ohmic contact 694,696 is located on each of the source region 682 and the n-well contact region 693. The rectifying junction contact 610 is utilized in place of the standard p+ implant drain 284 and ohmic contact 298 shown in FIG. 5B. Metallization layers and interlayer dielectric (ILD) are placed on the wafer surface and the ohmic contacts 694,696 are used to connect the source region 682 to metal interconnect 612 and the n-well contact region 693 to metal interconnect of the circuit. The rectifying junction contact 610 acts as both the drain side of the PMOS structure 680 and connects the drain side to the metal interconnect of the circuit.

As with the MOSFET devices described above, it has been found that significantly improved EOS/ESD triggering results in BJTs such as devices 24,25 may also be achieved by replacing an ohmic contact and accompanying collector region with a rectifying junction contact.

Figure 6:
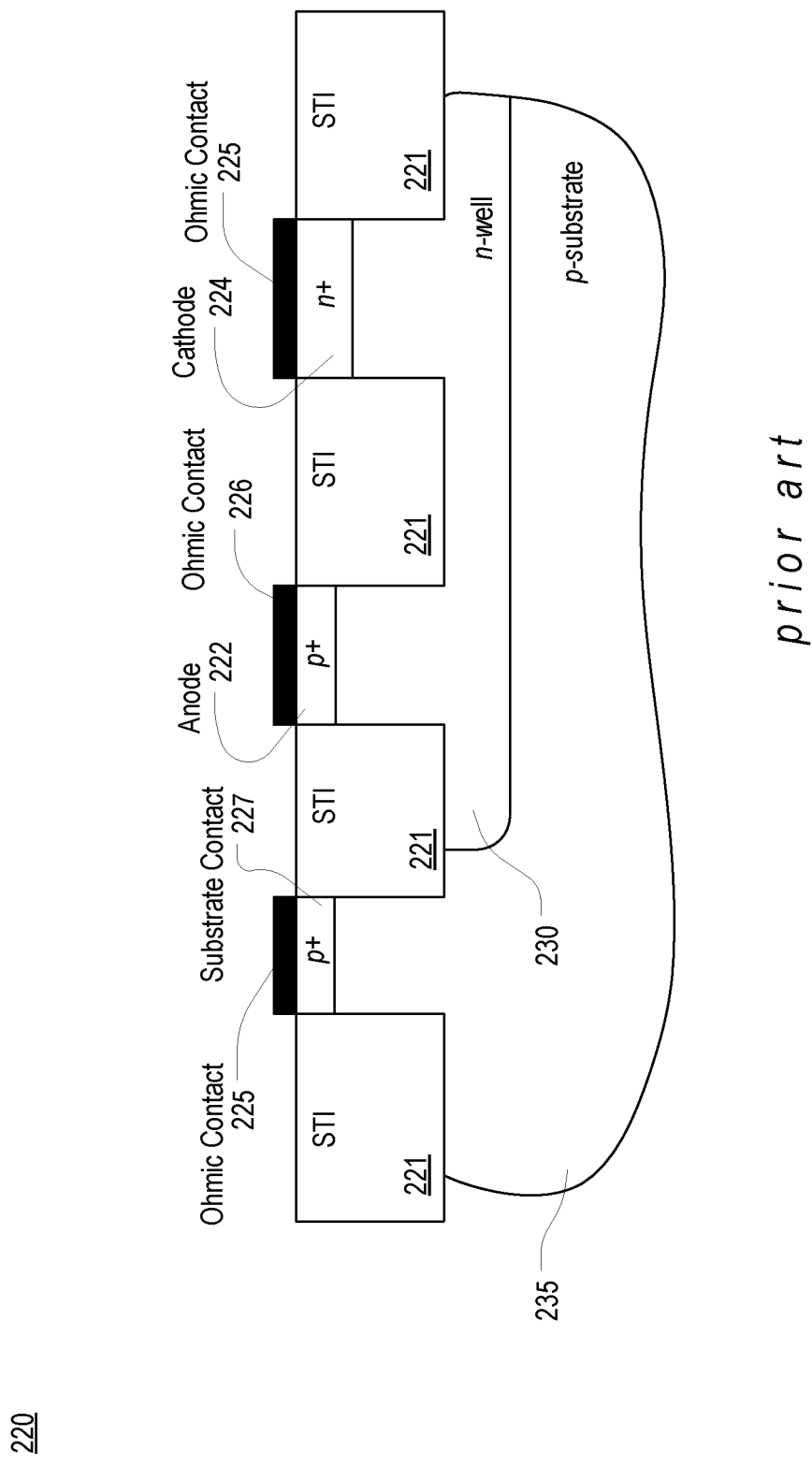
FIG. 6 is a schematic diagram illustrating a cross-section of an exemplary conventional shallow trench isolation (STI)-defined bulk CMOS p-n diode structure used for ESD protection.

As with the MOSFET devices described above, it has been found that significantly improved EOS/ESD triggering results in diodes may also be achieved by replacing an ohmic contact and accompanying anode region with a rectifying junction contact. By way of introduction, FIG. 6 is a schematic diagram illustrating a cross-section of an exemplary conventional shallow trench isolation (STI)-defined bulk CMOS p-n diode structure 220 used for ESD protection. Diode structures, including the exemplary diode structure of FIG. 6 and variations thereof, are used as protection devices 22 in the EOS/ESD protection circuits 20 shown generically in FIGS. 1 and 2. The structure 220 contains a p-substrate wafer 235 and an n-well region 230. The terminals of the diode structure 220 include a p+ region, forming an anode 222, and an n+ region, forming a cathode 224. The p+ anode 222 and n+ cathode 224 are defined by shallow trench isolation (STI) structures 221. Ohmic contact regions 225,226 are formed on the p+ anode 222 and the n+ cathode 224 using standard metallization techniques. A p+ substrate contact 227 with an ohmic contact region 225 is also provided to electrically connect to the substrate 235. Metallization layers and interlayer dielectric (ILD) are placed on the wafer surface. Shallow trench isolation (STI)-bound diode structures 220 may be used for ESD protection in bulk CMOS technology and RF technology.

Figure 9:
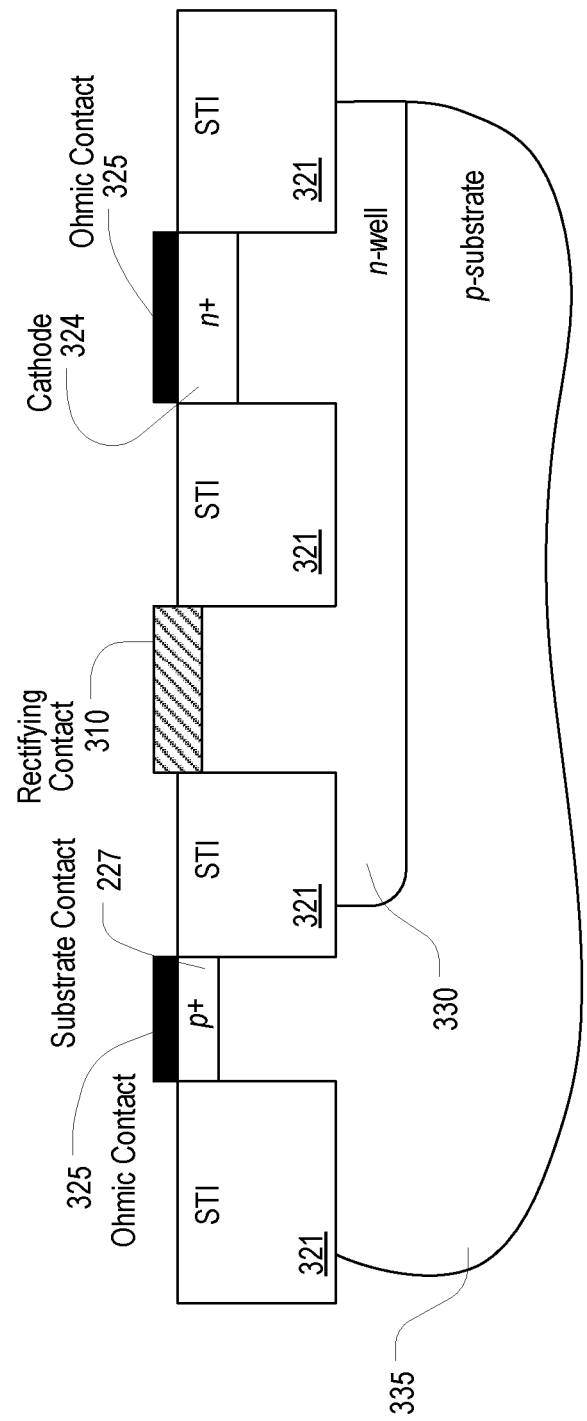
FIG. 9 is a cross-section of an exemplary Shallow Trench Isolation Schottky Barrier diode (STISBD) structure including a rectifying junction contact in accordance with another preferred embodiment of the present invention.

By comparison, FIG. 9 is a cross-section of an exemplary Shallow Trench Isolation Schottky Barrier diode (STISBD) structure 300 including a rectifying junction contact 310 in accordance with another preferred embodiment of the present invention. The structure 300 includes an n-well region 330 on a p-substrate wafer 335. The terminals of the structure 300 include a rectifying junction contact 310 and an n+ cathode 324, which are defined by shallow trench isolation (STI) structures 321. An ohmic contact region 325 is formed on the n+ cathode 324 using standard metallization techniques. However, in place of the standard p+ implant anode 222 and ohmic contact 226 shown in FIG. 6, a rectifying junction contact 310 forms the anode. A p+ substrate contact 327 with an ohmic contact region 325 is also provided to electrically connect to the substrate 335. Metallization layers and interlayer dielectric (ILD) are placed on the wafer surface.

Figure 2:
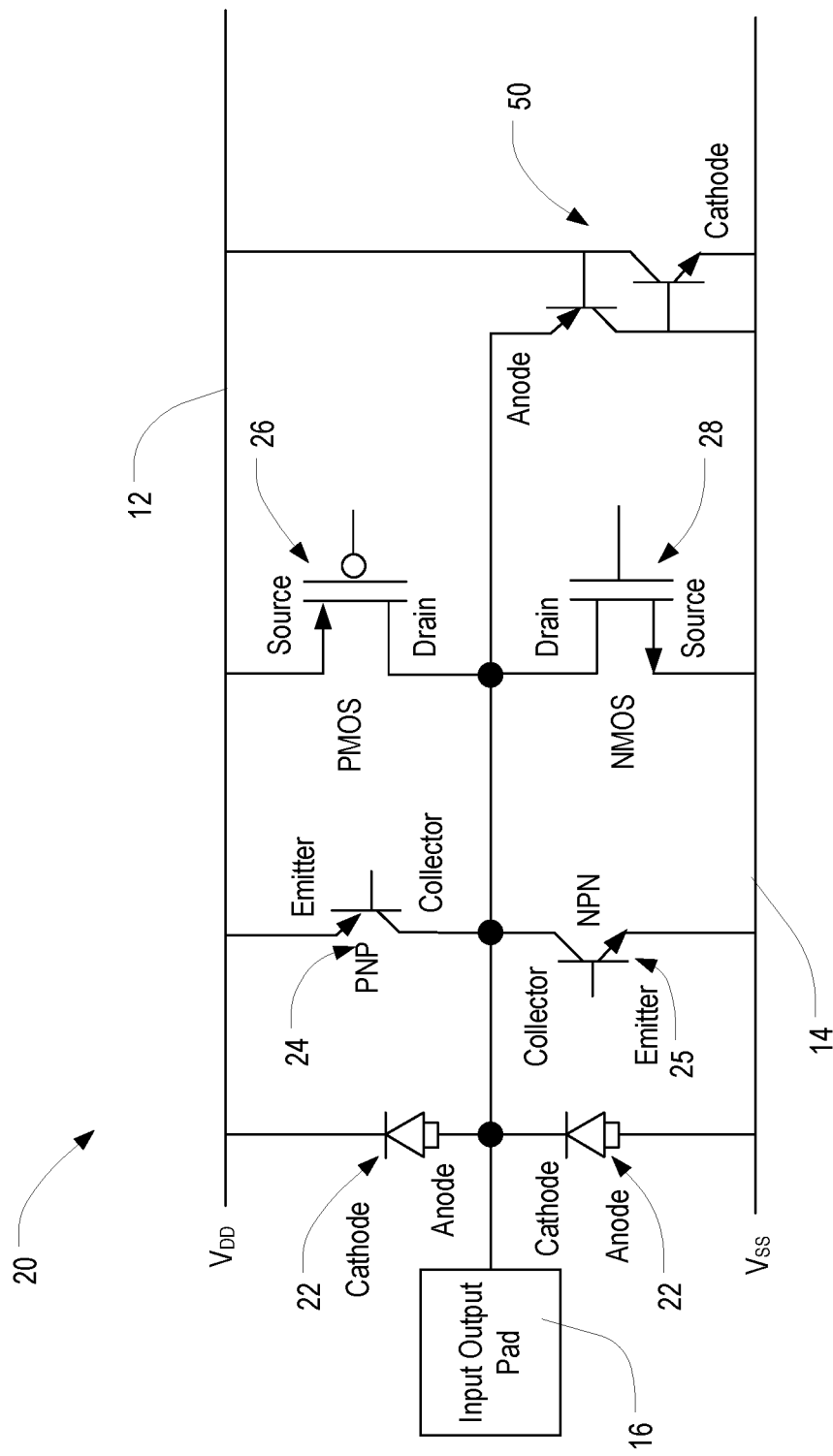
FIG. 2 is a generic circuit diagram illustrating various types of EOS/ESD protection circuits.

Thus, from the foregoing it will be understood that in various preferred embodiments, the drain implant area 222, 264,284 (device implant area connected to input/output pads 16 and/or I/O buffering devices 30, such as anode, collector, drain) of the exemplary semiconductor devices 22,24,25,26, 28 as shown in FIG. 2, and the corresponding ohmic contacts 226,296 as shown in FIGS. 5A, 5B and 6, are replaced by a process using a semiconductor and metal which creates a rectifying junction contact 310,610.

In protection circuits 20 like the illustrative NMOS and PMOS structures 660,680 of FIGS. 7A-8B or the illustrative diode 300 of FIG. 9, inclusion of a rectifying junction contact at the appropriate region improves the EOS/ESD conduction of the device by decreasing the snapback trigger, thereby protecting the standard I/O buffering circuits 30. More particularly, having a rectifying junction contact at the drain-to-substrate region of a MOSFET 26,28 improves the EOS/ESD conduction of the MOSFET 26,28 by decreasing the snapback trigger of the device; having a rectifying junction contact at the bipolar collector region of a BJT 24,25 improves the EOS/ESD conduction of the BJT 24,25 by decreasing the snapback trigger of the device; and having a rectifying junction contact at the anode region of a diode 22 improves the EOS/ESD conduction of the diode 22 by decreasing the snapback trigger of the device. The snapback mechanism is well known, but is summarized herein with reference to FIG. 10A, which is a graph 1000 showing a typical I-V characterization curve 1010 of an exemplary NMOS device under ESD stress. In the graph 1000, the x-axis represents the voltage (V) and the y-axis represents the current (I). The breakdown voltage ($V_{BD}$) 1012 is the voltage at which junctions in the NMOS device begin to avalanche. As noted previously, in designing the device, it is necessary to keep the avalanche breakdown voltage below the gate oxide breakdown voltage to avoid gate oxide breakdown, wherein a direct path is created through the gate oxide to the substrate. The snapback point ($V_{T1},I_{T1}$) 1014 corresponds to the voltage and current levels at which snapback triggers. Beyond this point, conduction continues with increasing currents, but at much lower voltages. The holding point ($V_H,I_H$) 1016 corresponds to the holding voltage and the current level at that voltage.

Figure 10A:
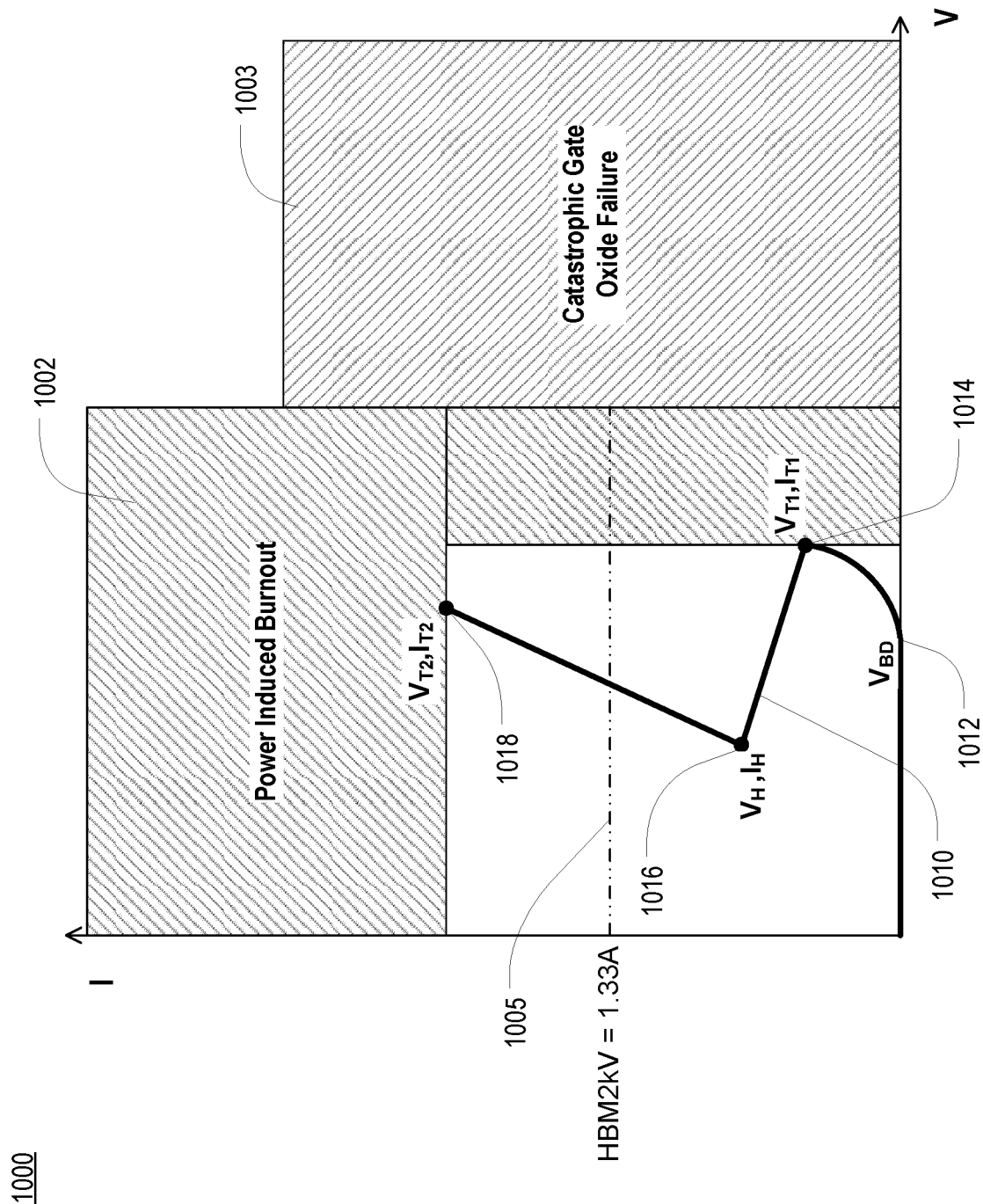
FIG. 10A, which is a graph showing a typical I-V characterization curve of an exemplary NMOS device under ESD stress.

Depending on the device and the holding point values, reliable operation may or may not continue at higher voltage and current levels. In FIG. 10A, $V_{T2},I_{T2}$ 1018 is the point at which snapback current is destructive. In other words, above these levels, the NMOS suffers power-induced burnout 1002. An ESD event is generally characterized by a spike in current at the I/O pads 16. In the IC industry, ESD devices, such as the exemplary NMOS device 28 in FIG. 2, always have a performance target. The Human Body Model (HBM) is a commonly used model which characterizes the susceptibility of an IC device to damage from ESD, and more specifically it simulates the discharge that might occur when a human touches an electronic device. The graph 1000 shows an exemplary peak line of 1.33 A 1005, based on a standardized Human Body Model (HBM) applied voltage of 2 kV. If $I_{T2}$ is greater than 1.33 A, then the part may be considered to pass ESD. Overall, then, the device is considered to be subject to catastrophic failure in the shaded areas, while the unshaded areas represent the "safe operating area" ("SOA") for the device.

Figure 10B:
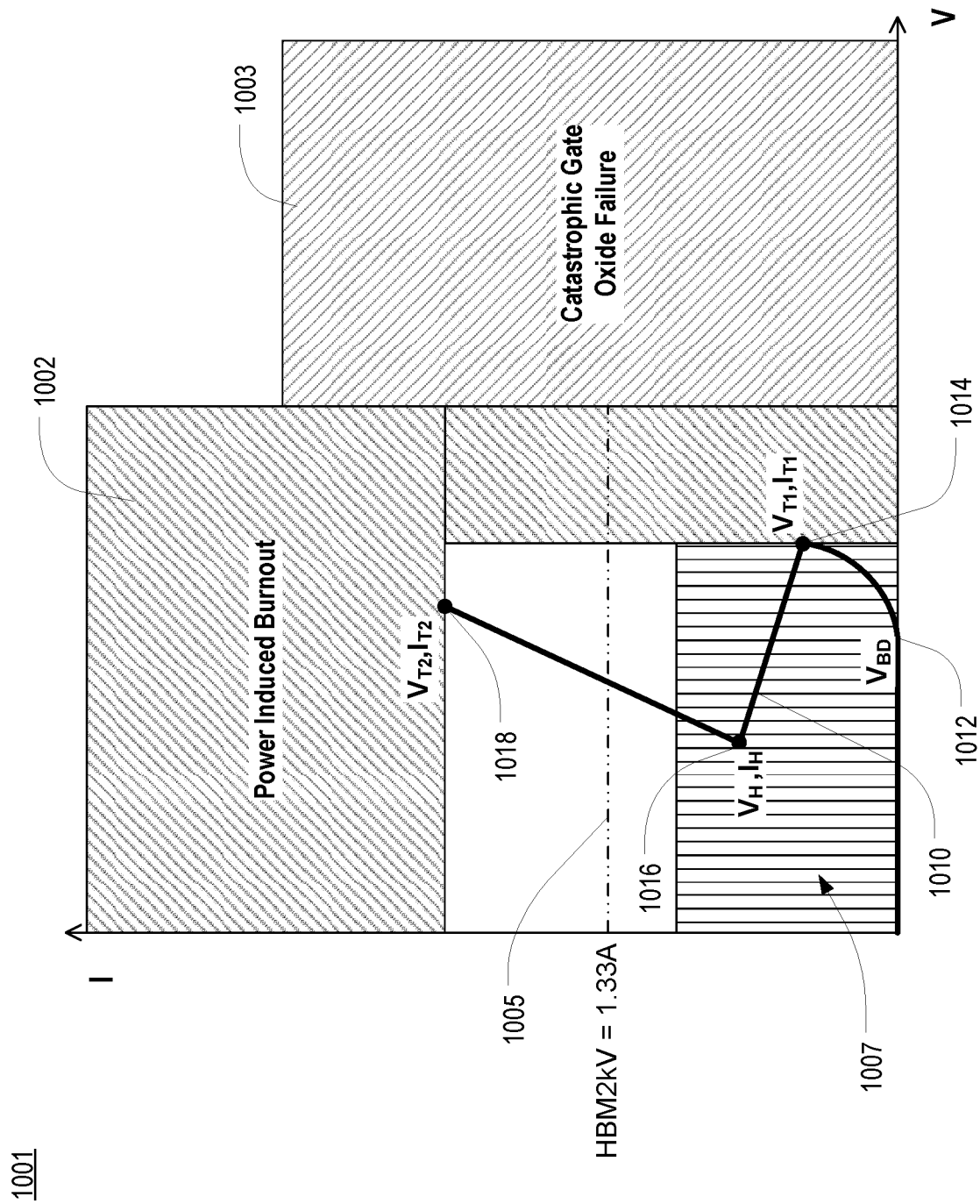
FIG. 10B is a graph similar to that of FIG. 10A but illustrating a more limited SOA that extends above the holding point ($V_H, I_H$) but ends well below $V_{T2}, I_{T2}$.

Notably, other semiconductor industry standards may define a more limited safe operating area (SOA) for a device. In this regard, it is noted that a device can experience an ESD event that it can survive for a short period of time, but not indefinitely. Some standards omit this portion of I-V characterization curve 1010 from the SOA for the device. In this regard, FIG. 10B is a graph 1001 similar to that of FIG. 10A but illustrating a more limited SOA 1007 that extends above the holding point ($V_H, I_H$) 1016 but ends well below $V_{T2}, I_{T2}$ 1018. For purposes of simplifying the analysis herein, specific consideration of time to failure, which might extend or limit the SOA 1007, is omitted, and any area below the 2 kV HBM threshold 1005 as passing ESD requirements and part of a SOA.

Figure 3:
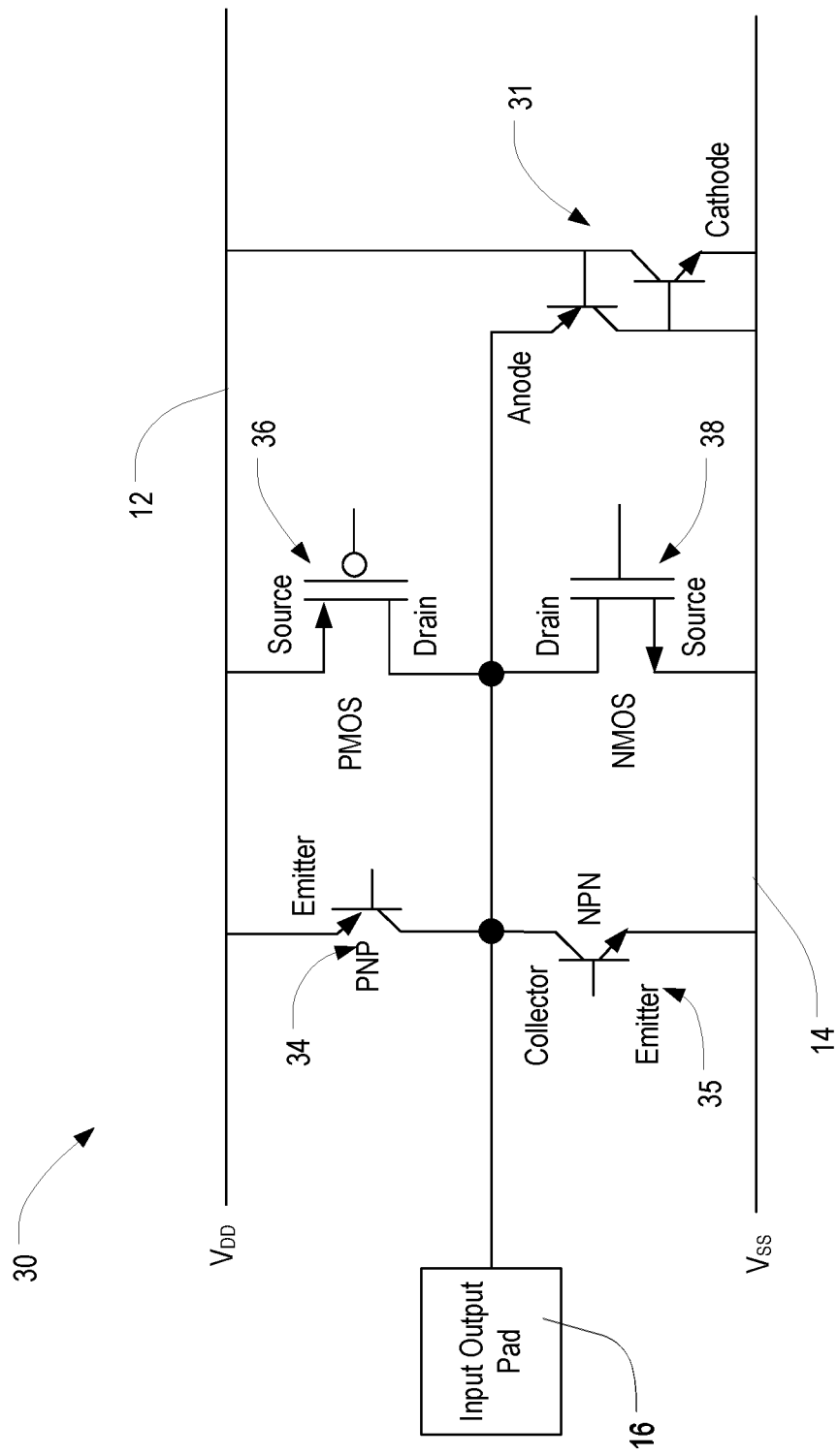
FIG. 3 is a generic circuit diagram illustrating various types of input/output buffering circuits.
Figure 4:
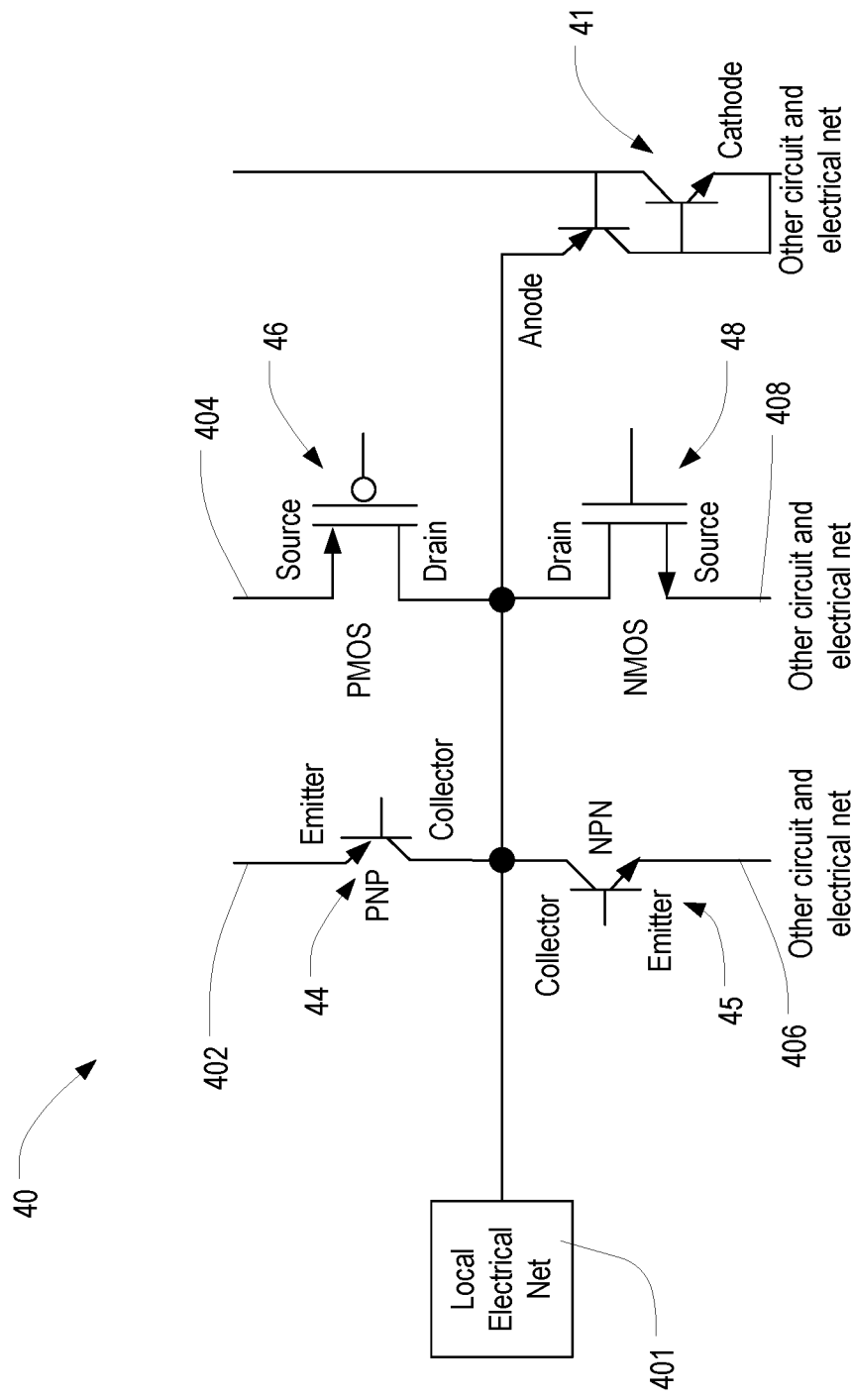
FIG. 4 is a generic circuit diagram illustrating various types of internal circuits found in the core of a CMOS IC.
Figure 5A:
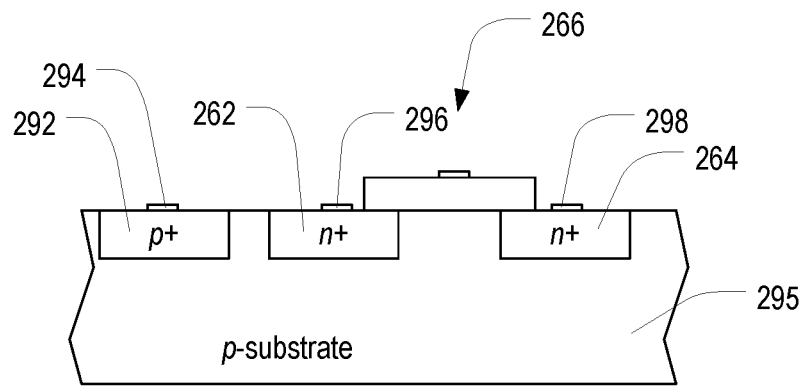
FIG. 5A is a schematic diagram illustrating a cross-section of an exemplary conventional NMOS device fabricated in a single well CMOS process.
Figure 5B:
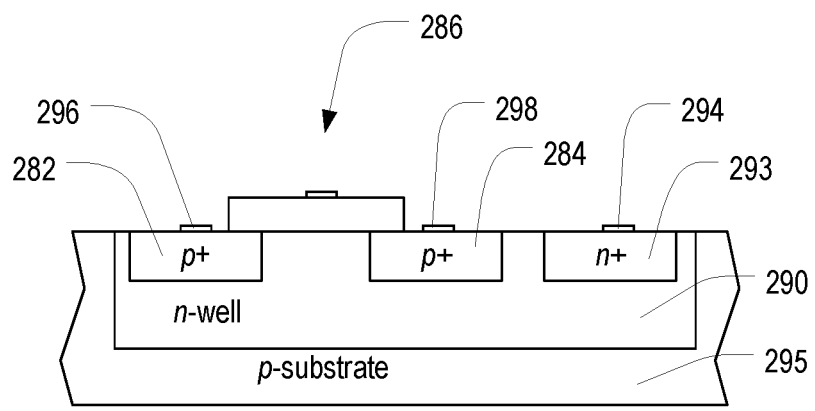
FIG. 5B is a schematic diagram illustrating a cross-section of an exemplary conventional PMOS device fabricated in a single well CMOS process.
Figure 11:
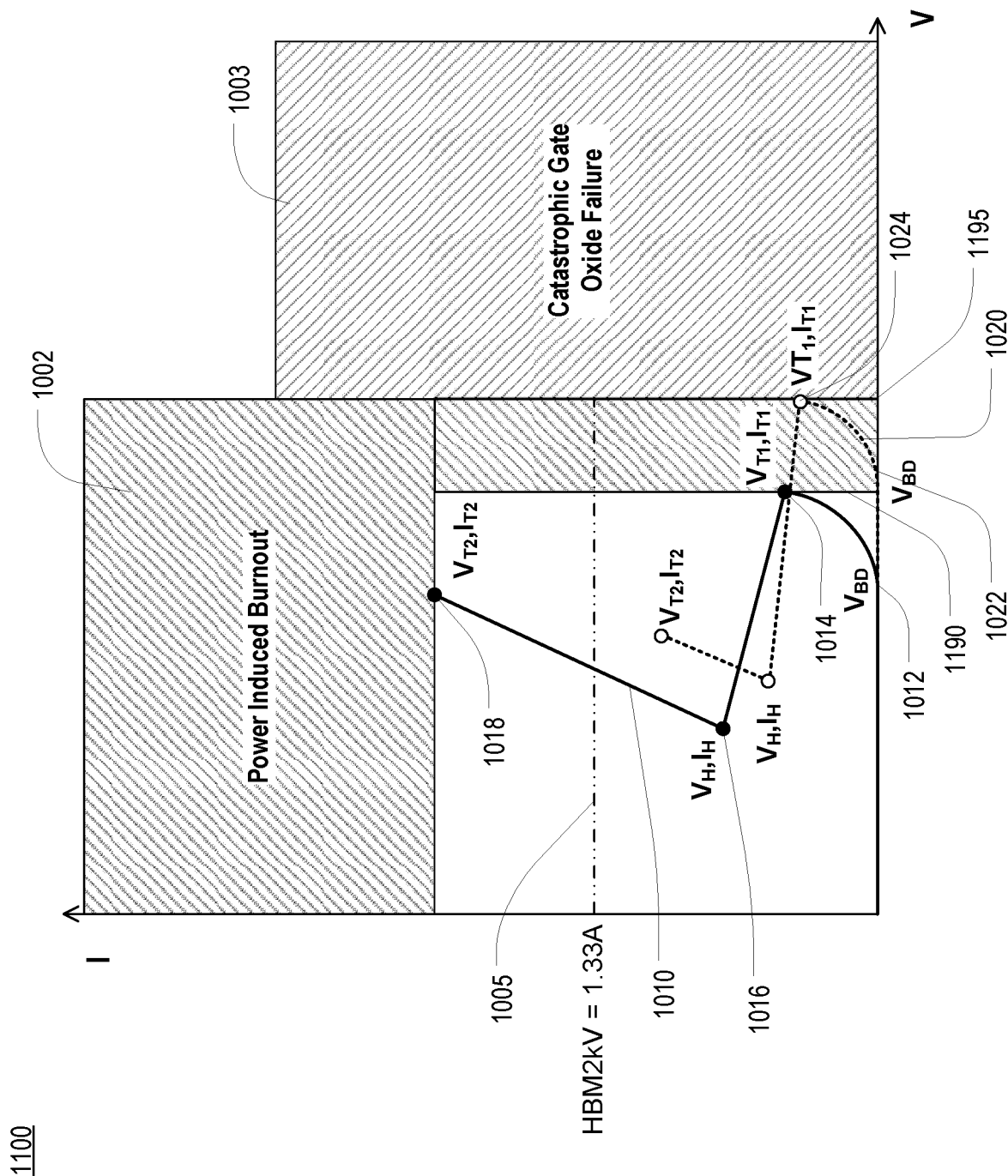
FIG. 11 is a graph comparing a typical I-V characterization curve for an exemplary ESD device, such as those described with respect to FIG. 2, to the curve for an exemplary functional device, such as those described with respect to FIGS. 3 and 4.

The relationship between ESD protection devices 20 and functional devices 30,40 in an IC 10 is reflected in FIG. 11, which is a graph 1100 comparing a typical I-V characterization curve 1010 for an exemplary ESD device 20, such as those described with respect to FIG. 2, to the curve 1020 for an exemplary functional device 30,40, such as those described with respect to FIGS. 3 and 4. The I-V characterization curve 1010 for the ESD device can handle 1.33 A, passing the 2 kV HBM threshold 1005 without catastrophic failure. The purpose of these ESD devices, as described above, is to "trigger" or snapback at the lower $V_{T1}$ 1014, before the I/O buffering devices 30 (protected devices) and internal devices 40 are at risk for snapback. In the I-V characterization curve 1020 for a typical functional device 30,40, the snapback point ($V_{T1}, I_{T1}$) 1024 represents a typical snapback point of the functional device. Significantly, for a functional device 30,40, the snapback point 1024 also represents catastrophic gate oxide failure 1003.

Because essentially the same power is being applied to both the protection devices 20 and the functional devices 30,40, it is desirable for the snapback voltage $V_{T1}$ for the ESD devices 20 to be less than such voltage $V_{T1}$ for the functional devices 30,40, because the sooner the ESD device 20 is triggered, the better guarantee the functional devices 30,40 are protected from the risk of snapback. Thus, by replacing the drain area and ohmic contact of a device with a rectifying junction contact 310,610 as shown, for example, in FIGS. 7A-9, the snapback trigger ($V_{T1}, I_{T1}$) 1014 decreases to improve the ESD conduction of the snapback device, with the resulting ESD device serving to protect the functional devices 30,40 described with respect to FIGS. 3 and 4.

Improved Immunity/Tolerance for EOS/ESD Events in Functional Devices

As described above, it has been found that significantly improved EOS/ESD triggering results in conventional NMOS and PMOS devices may be achieved by replacing an ohmic contact and accompanying drain region with a rectifying junction contact. By way of further illustration, it has also been found that better immunity/tolerance for EOS/ESD events in conventional NMOS and PMOS devices may be achieved by replacing an ohmic contact and accompanying source region with a rectifying junction contact. As noted previously, the design margin is commonly defined as the difference between avalanche breakdown voltage 1190 ($V_{T1}$) and gate oxide breakdown voltage 1195 ($V_{T1}$). While lowering the snapback point $V_{T1}, I_{T1}$ for protection devices 20 improves their operation, raising the snapback point $V_{T1}, I_{T1}$ on the graph for the I/O buffering devices 30 and internal devices 40 gives these functional devices a better immunity/tolerance for EOS/ESD events. In another preferred embodiment of the present invention to be described below, replacing the source area and ohmic contact with a rectifying junction contact allows for a higher $V_{T1}, I_{T1}$ point on their I-V curve.

Figure 13A:
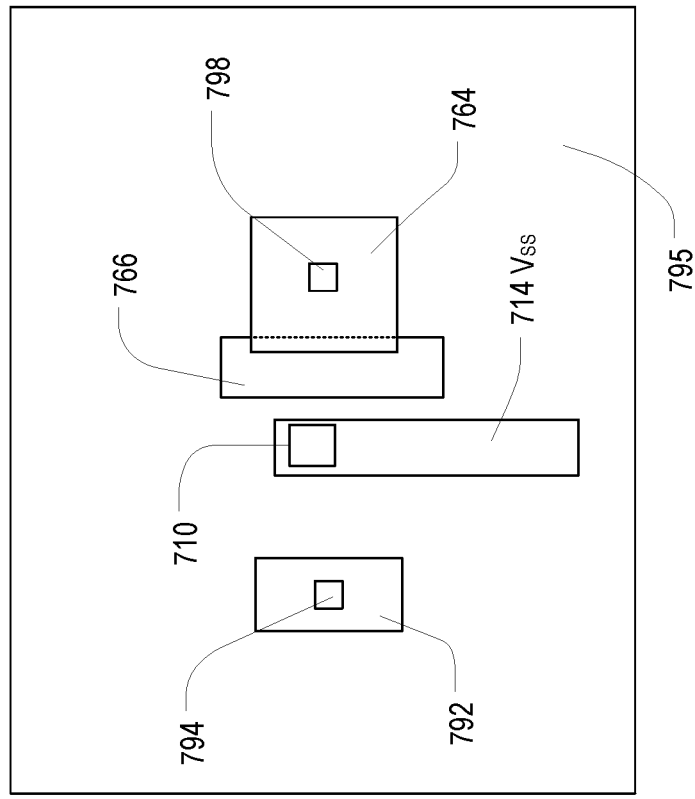
FIG. 13A is a top view of the exemplary tolerating NMOS structure of FIG. 12A.
Figure 12A:
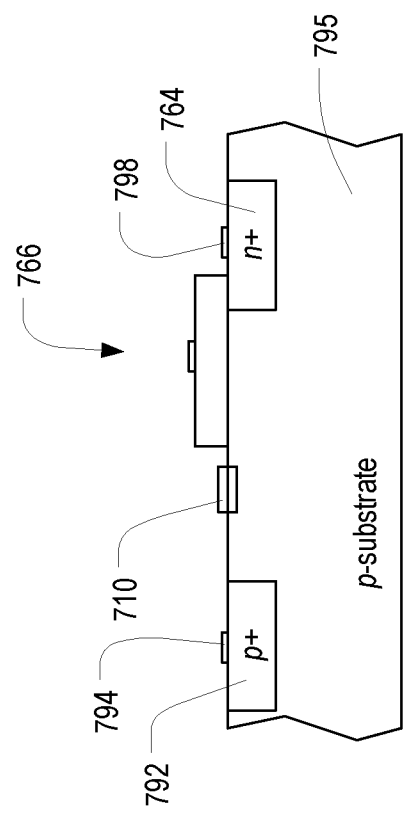
FIG. 12A is a cross-section of an exemplary self-protecting or tolerating NMOS structure where a rectifying junction contact replaces both the n+ source region and the ohmic contact on the n+ source region in accordance with one or more preferred embodiments of the present invention.

FIG. 12A is a cross-section of an exemplary self-protecting or tolerating NMOS structure 760 where a rectifying junction contact 710 replaces both the n+ source region 262 and the ohmic contact 296 on the n+ source region, while FIG. 13A is a top view of the tolerating NMOS structure 760 of FIG. 12A, all in accordance with one or more preferred embodiments of the present invention. Similarly, FIG. 12B is a cross-section of an exemplary self-protecting or tolerating PMOS structure 780 where a rectifying junction contact 710 replaces both the p+ source region 282 and ohmic contact 296, while FIG. 13B is a top view of the exemplary tolerating PMOS structure 780 of FIG. 12B, all in accordance with one or more preferred embodiments of the present invention.

With reference to FIGS. 5A, 12A, and 13A, the NMOS structure 760 is fabricated in a single well CMOS process built on a p-substrate 795. The structure 760 further includes a rectifying junction contact 710, an n+ drain region 764, a gate structure 766, and a p-substrate contact region 792. A respective ohmic contact 794,798 is located on each of the drain region 764 and the p-substrate contact region 792. The rectifying junction contact 710 is utilized in place of the standard n+ implant source 262 and ohmic contact 296 shown in FIG. 5A. Metallization layers and interlayer dielectric (ILD) are placed on the wafer surface, and the ohmic contacts 794,798 are used to connect the drain region 764 and the p-substrate contact region 792 to metal interconnect of the circuit (i.e., local interconnect, input signal to a device, or the like). The rectifying junction contact 710 both acts as the source side of the NMOS structure 760 and connects the source side to the metal interconnect 714 of the circuit.

Figure 13B:
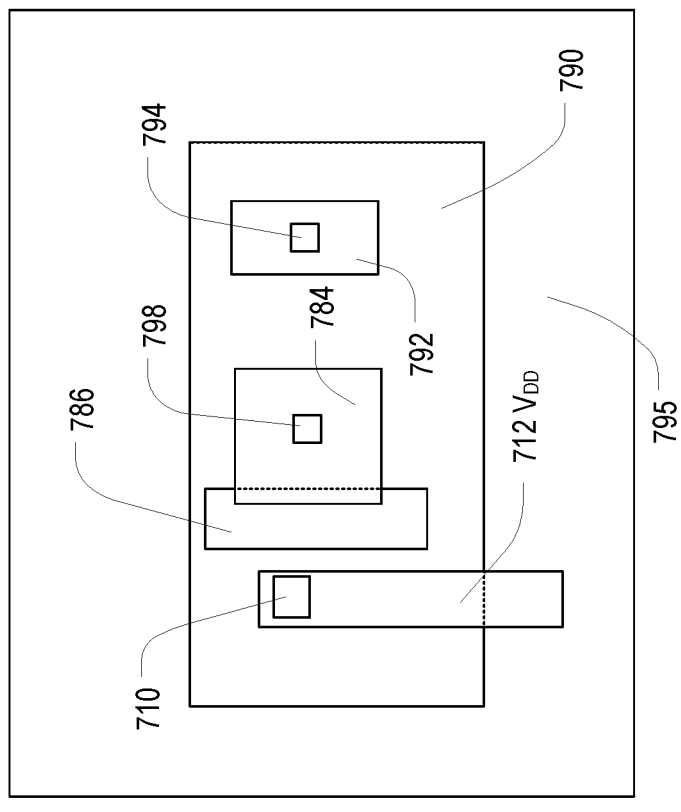
FIG. 13B is a top view of the exemplary tolerating PMOS structure of FIG. 12B.
Figure 12B:
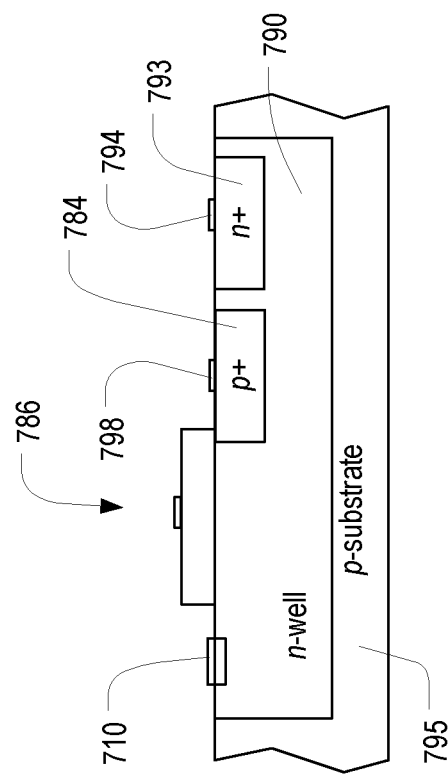
FIG. 12B is a cross-section of an exemplary self-protecting or tolerating PMOS structure where a rectifying junction contact replaces both the p+ source region and ohmic contact in accordance with one or more preferred embodiments of the present invention.

With reference to FIGS. 5B, 12B, and 13B, the PMOS structure 780 is also fabricated in a single well CMOS process built on a p-substrate 795. The structure 780 further includes a p+ drain region 784 and a rectifying junction contact 710 located in an n-well region 790 (single well region), a gate structure 786, and an n-well contact 793 (also disposed in the n-well region 790). A respective ohmic contact 794,798 is located on the each of the drain region 784 and the n-well contact region 793. The rectifying junction contact 710 is utilized in place of the standard p+ implant source 282 and ohmic contact 296 shown in FIG. 5B. Metallization layers and interlayer dielectric (ILD) are placed on the wafer surface, and the ohmic contacts 794,798 are used to connect the drain region 784 and the n-well contacts 793 to metal interconnect of the circuit. The rectifying junction contact 710 acts as both the source side of the PMOS structure 780 and connects the source side to the metal interconnect 712 of the circuit.

As with the MOSFET devices 760,780 described above, it has been found that significantly improved EOS/ESD immunity and overvoltage tolerance in BJTs may also be achieved by replacing an ohmic contact and accompanying emitter region with a rectifying junction contact.

Thus, from the foregoing it will be understood that in various preferred embodiments, the source implant area 262,282 (device area connected to VDD or Vss, such as emitter, source, cathode) of the exemplary semiconductor devices 31,34,35,36,38,41,44,45,46,48 as shown in FIGS. 3 and 4, and the corresponding ohmic contacts 296,298 as shown in FIGS. 5A and 5B, are replaced by a process using a semiconductor and metal which creates a rectifying junction contact 710.

In functional circuits 30,40 like the illustrative NMOS and PMOS structures 760,780 of FIGS. 12A-13B, inclusion of a rectifying junction contact at the appropriate region improves the EOS/ESD immunity and overvoltage tolerance of the functional circuits. More particularly, having a rectifying junction contact at the source-to-substrate region of a MOSFET 36,38 improves the EOS/ESD immunity and overvoltage tolerance of the MOSFET 36,38 by increasing the snapback trigger of the device; and having a rectifying junction contact at the bipolar emitter region of a BJT 34,35 improves the EOS/ESD immunity and overvoltage tolerance of the BJT 24,25 by increasing the snapback trigger of the device.

Figure 14:
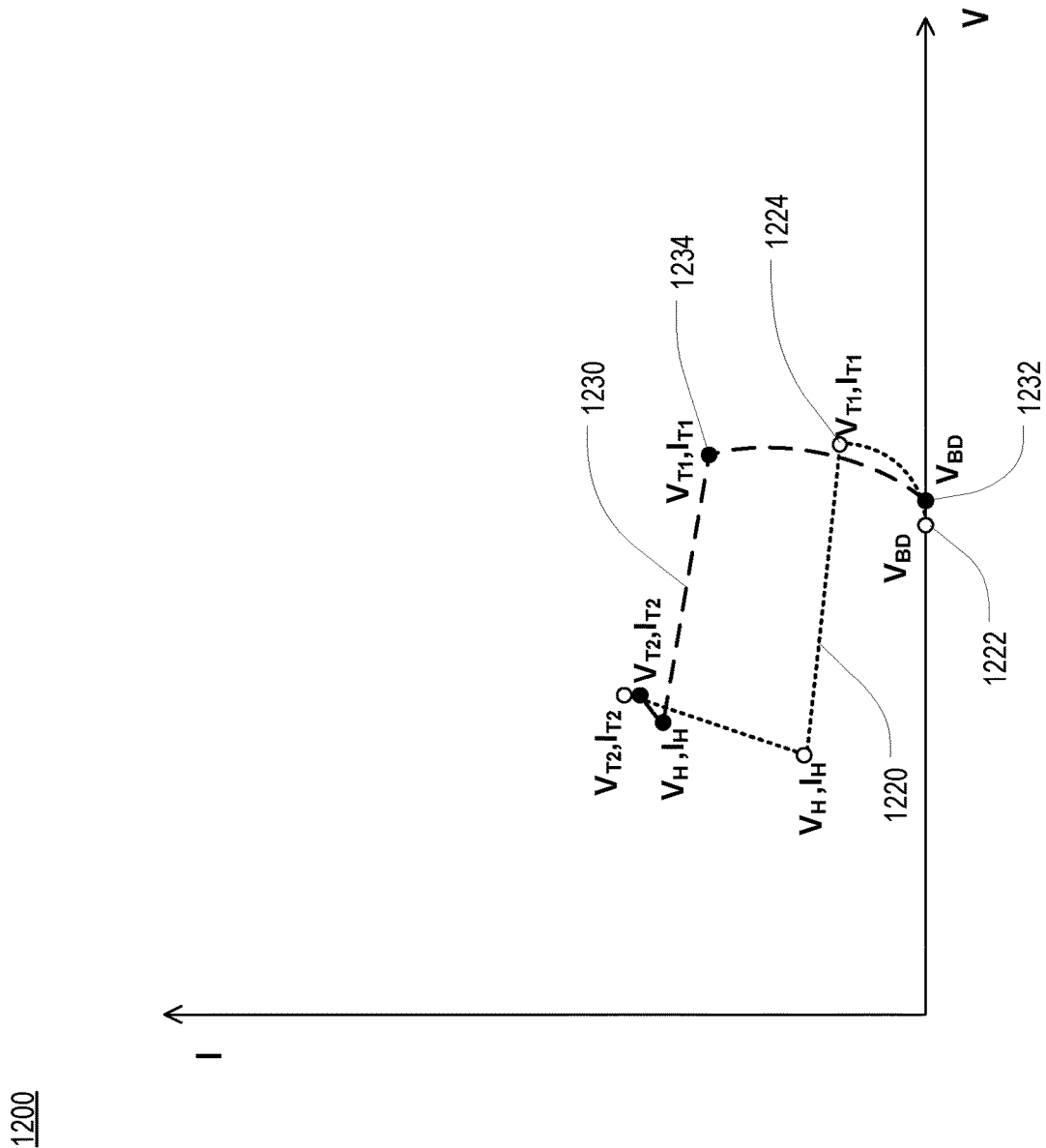
FIG. 14 is a graph showing typical I-V characterization curves for two exemplary functional devices.

The effect of substituting a rectifying junction contact 710 for a source-to-substrate region, bipolar emitter region, or the like and its corresponding ohmic contact is illustrated in FIG. 14, which is a graph 1200 showing typical I-V characterization curves 1220,1230 for two exemplary functional devices 30,40. In the graph 1200, the x-axis represents the voltage (V) and the y-axis represents the current (I). The two exemplary devices are similar except that one curve 1220 pertains to a device 30,40 in an IC 10 without a rectifying junction contact, and the other curve 1230 pertains to a similar device but with a rectifying junction contact 710 substituted as described in FIGS. 12A-13B. When replacing the source area 762,782 and ohmic contact 796 with a rectifying contact 710, the $I_{T1}$ of the snapback point ($V_{T1}$, $I_{T1}$) 1234 for the I-V characterization curve 1230 of the device is substantially higher than the $I_{T1}$ of the snapback point ($V_{T1}$,$I_{T1}$) 1224 for the I-V characterization curve 1220 of the original device. In the graph 1200, the two curves 1220,1230 have relatively similar breakdown voltages ($V_{BD}$) 1222,1232 and snapback voltages ($V_{T1}$) which gives them a similar operating voltage range. However, the increased $I_{T1}$ for the snapback point 1234 of the second curve 1230 means that any EOS event that exceeds the breakdown voltage ($V_{BD}$) 1232 must provide more overall power to trigger a failure as compared to the lower $I_{T1}$ for the snapback point 1224 of the first curve 1220. For example, a typical EOS event affecting a functional device 30,40 is characterized by a voltage spike. The rectifying junction contact on the source area (connected to Vss or VDD) alters the electrical characteristics of the functional device 30,40, allowing it to load down the EOS event and requiring that event to be able to deliver more power before triggering a failure.

Figure 15:
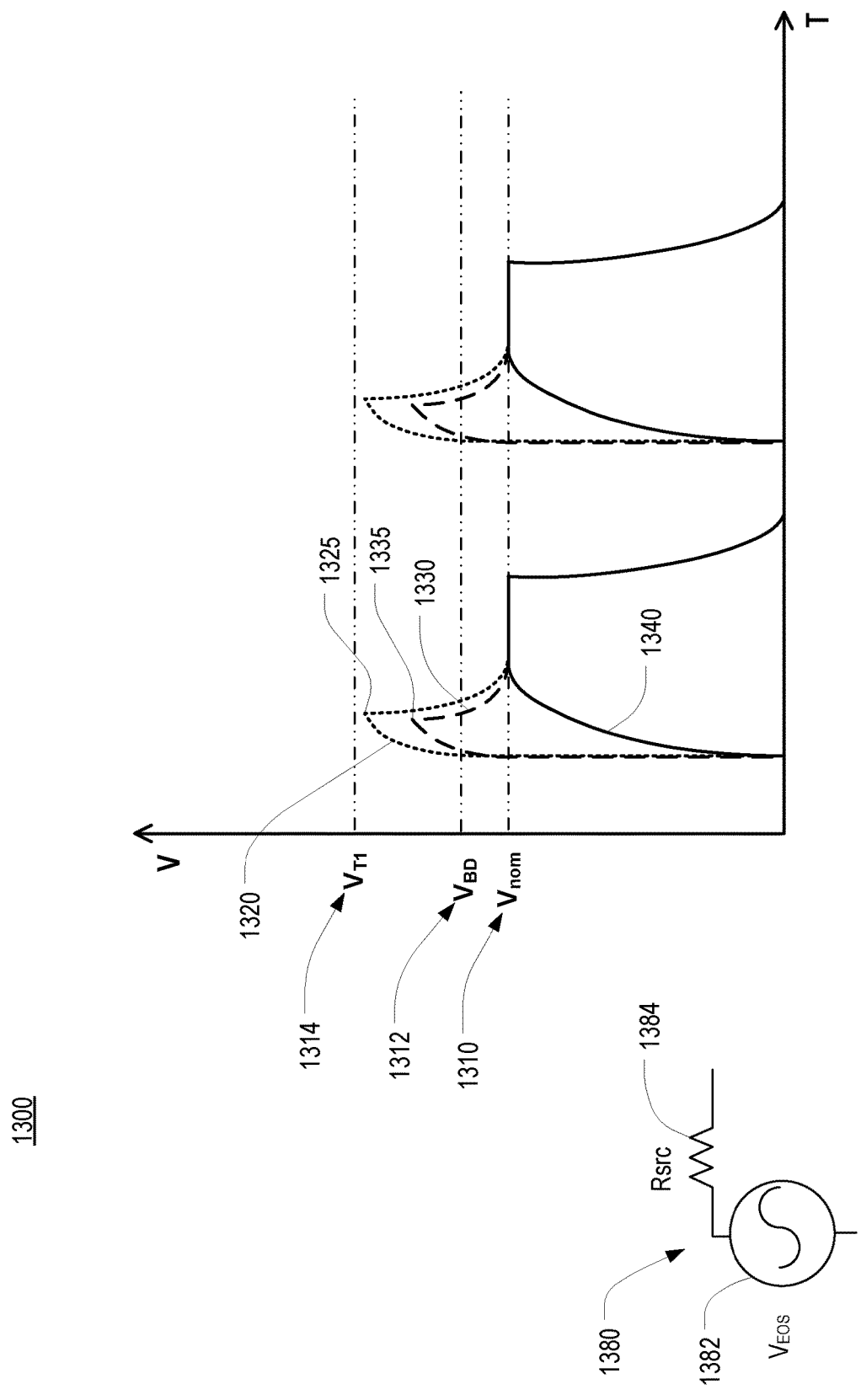
FIG. 15 is a graph of three voltage curves during an EOS event for the two exemplary functional devices represented by the I-V characterization curves of FIG. 14.

This is further illustrated in FIG. 15, which is a graph 1300 of three voltage curves 1320,1330 during an EOS event for the two exemplary functional devices 30,40 represented by the I-V characterization curves 1220,1230 of FIG. 14. In the graph 1300, the x-axis represents time (T) and the y-axis represents the voltage (V). A reference curve 1340 represents an ideal voltage curve for a particular functional device, wherein the voltage peaks at a nominal voltage ($V_{nom}$) 1310. As with the curves 1220,1230 of FIG. 14, one voltage curve 1320 pertains to the device 30,40 in an IC 10 without a rectifying junction contact, and the other curve 1330 pertains to a similar device but with a rectifying junction contact 710 substituted as described in FIGS. 12A-13B. The same EOS event 1380, represented by the same source impedance 1384 and source voltage 1382 model, is provided to the device 30,40 with and without the rectifying junction contact in place. When the EOS event 1380 occurs, a voltage spike is experienced by the device. Because the power remains the same in each case, the increased snapback current ($I_{T1}$) in the curve 1230 for the device with the rectifying junction contact creates a greater load for the event than for the other device, reducing the peak voltage 1335 relative to the peak voltage 1325 of the other device. The increased $I_{T1}$ of the device with the rectifying junction contact presents a lower load line, clamps the event more, and limits how fast the voltage approaches $V_{T1}$ 1314. In summary, using the exemplary devices 760,780 with the rectifying junction contact 710 allows the device 760,780 to load down any electrical overstress (EOS) event, requiring that the event be able to deliver more power before triggering a failure in the device.

The exemplary NMOS and PMOS devices described and/or illustrated herein are able to withstand EOS/ESD conditions at different stages of manufacturing/assembly and/or during normal circuit operation, which may have previously caused a failure. Also, due to the self-protecting characteristics of these devices 760,780, especially in the I/O buffering circuits 30, the area required by protection circuits 20 in an IC 10 may also be minimized.

It will be appreciated that while aspects of the present invention related to protection devices have primarily been described with respect to exemplary NMOS and PMOS devices, rectifying junction contacts may be used to replace the drain area of a variety of active CMOS devices, with the drain being defined as the device terminal directly connected to the electrical network that supplies the disruptive (ESD/EOS) event. For example, in the case of exemplary BJTs, the drain area is referred to as the collector and for diodes the anode.

It will also be appreciated that while aspects of the present invention related to functional devices have also primarily been described with respect to exemplary NMOS and PMOS devices, rectifying junction contacts may also be used to replace the source area of a variety of active CMOS devices, with the source being defined as the device terminal that is not directly connected to the electrical network that supplies the disruptive (ESD/EOS) event. In the case of exemplary BJTs, the source area is referred to as the emitter and for exemplary diodes the cathode.

Figure 16:
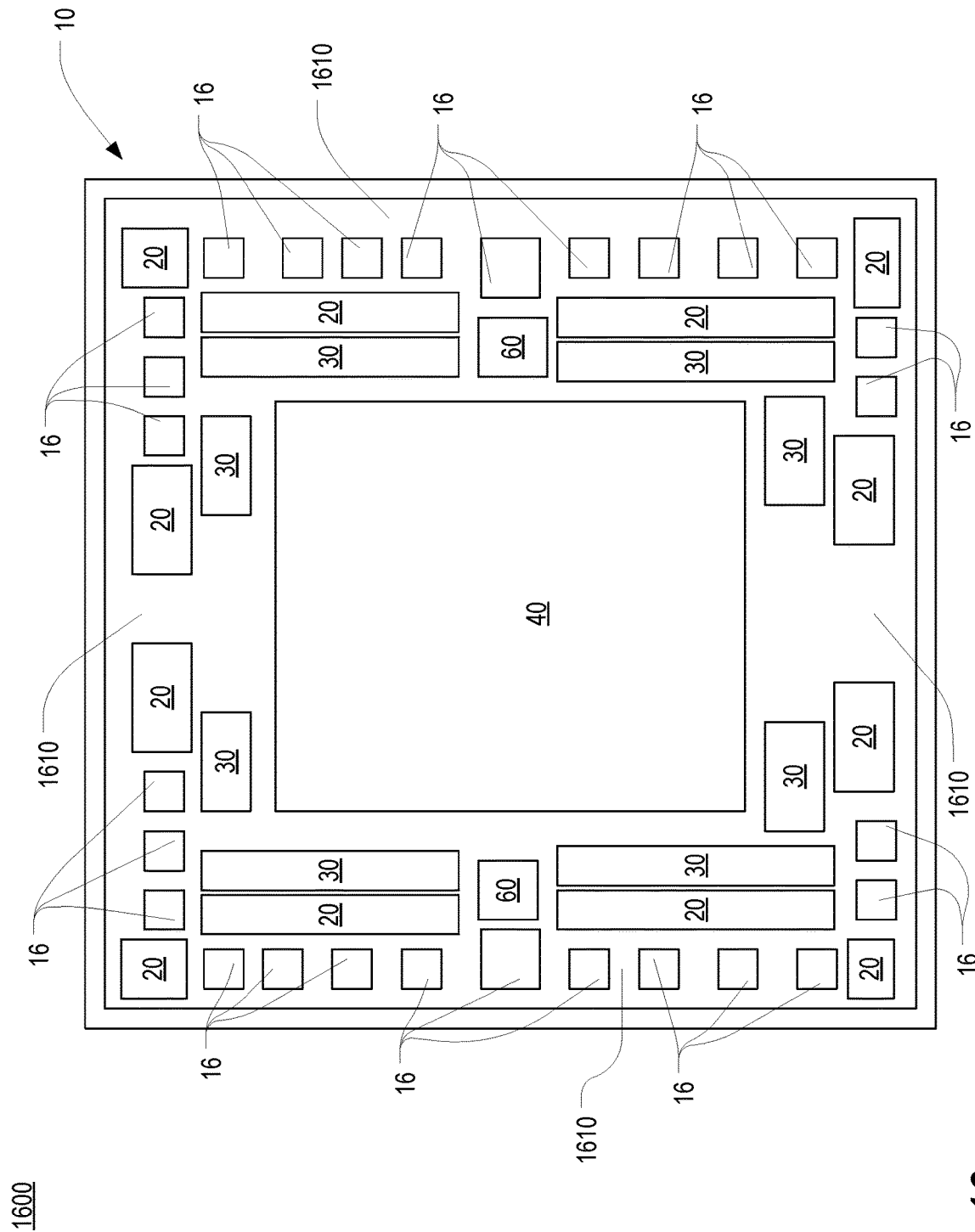
FIG. 16 is a schematic diagram illustrating a typical high-level floor plan for the integrated circuit of FIG. 1.

FIG. 16 is a schematic diagram illustrating a typical high-level floor plan 1600 for the integrated circuit 10 of FIG. 1. Although it is noted that an integrated circuit 10 may be implemented in a wide variety of ways, it will be appreciated that layouts generally similar to the floor plan 1600 of FIG. 16 are quite common. For example, it is common to arrange I/O pads 16 in a ring 1610 near the perimeter of the IC 10, with the I/O buffering circuits 30, ESD devices 20, and power MOSFETS 60 (such as LDMOS devices) located nearby in the ring 1610, and the internal circuits 40 forming the core of the IC 10 both logically and physically. While ESD devices 20 can take up large areas of the I/O ring 1610 of a CMOS device, the ability to substitute a functional device having a rectifying junction contact on a source or a protection device having a rectifying junction contact on the drain, in accordance with various embodiments of the present invention, allows flexibility choosing the tradeoffs between limited space for devices for ESD protection and performance of functional devices. With regard to performance, it should be noted that replacing the source area and ohmic contact of a functional device with a rectifying junction contact does cause the device an inherently higher current leakage due to the increased power consumption. However, use of a rectifying junction contact in place of the source area and ohmic contact allows for a more tolerating device, thus potentially allowing the use of fewer ESD protection devices and requiring less space, and that can be very useful to a designer.

Various examples of the design flexibility afforded by the invention will be apparent. In a first example, in an IC 10 where greater ESD protection is necessary and space is limited in the I/O ring 1610, but performance of the functional circuitry 40 has some tolerance, a designer now has the option to replace the source area and ohmic contacts of devices susceptible to ESD/EOS events with rectifying junction contacts 710 instead of increasing the space necessary for more ESD devices. In a second example, in the same situation described with respect to the first example, a designer also has the option of keeping a similar ESD protection in the I/O ring 1610 by reducing the size of a particular ESD device and replacing it with a smaller similar device that has a rectifying junction contact 610 in place of the drain area and ohmic contact area of the ESD device. In a third example, when performance of the functional devices has limited tolerance and cannot handle the added current leakage that would be caused by substituting a device with the less optimal rectifying junction contact 710 in place of the source area and ohmic contact, the designer can improve the triggering of the necessary ESD protection devices by replacing the drain area and ohmic contacts with the rectifying junction contacts 610.

It is understood that alternate structures and methods exist for establishing equivalent MOSFET devices. Alternate rectifying junction contacts can include pure metal source (and/or drain) without the interfacial dopant segregation layer. Alternate silicides can be utilized without an interfacial dopant segregation layer. Suitable refractory metals may include, without limitation, Co, Ni, Ni/Pt, Pd, Pt, Ta, TaN, Ti, TiN, and W. The rectifying junction contacts can include pure metal source/drains with interfacial insulating layers.

A further additional embodiment for processing with CMOS elements is performing the depositions of the CMOS silicide and the rectifying junction contact silicide and performing a single thermal process step for both silicides. For the case where a single thermal processing step is used for the silicides, an additional embodiment is performing the dopant segregation implant before the CMOS silicidation.

It will be understood by those skilled in the art that the embodiments can be implemented in substrate wafer materials commonly used in the semiconductor industry including, without limitation, bulk silicon, SOI, SiC, SiGe, GaN, GaAs, InP, and the like. The use of a particular starting material or material system should not be limited to those explicitly specified. The objective is to be able to build rectifying junction contacts within the wafer, thus typical semiconductor-based starting material should be considered.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A method of designing an integrated circuit with enhanced EOS/ESD robustness, comprising the steps of:
    (a) designing a plurality of input/output pads in the integrated circuit;
    (b) designing a positive voltage rail in the integrated circuit;
    (c) designing a ground voltage rail in the integrated circuit;
    (d) designing a collection of internal circuits, in the integrated circuit, representing the operational core of the integrated circuit in the integrated circuit;
    (e) designing a plurality of input/output buffering circuits, in the integrated circuit, connected as inputs and outputs to the internal circuits, wherein the internal circuits and the input/output buffering circuits comprise functional devices; and
    (f) designing a plurality of EOS/ESD protection circuits, in the integrated circuit, interconnected with the input/output pads to limit ESD voltage and/or shunt ESD current away from the functional devices, wherein at least one of the EOS/ESD protection circuits is a MOSFET;
    (g) wherein designing the MOSFET includes designing a source region of the MOSFET to have an accompanying ohmic contact and designing the MOSFET to have a rectifying junction contact in place of a drain region and accompanying ohmic contact of the MOSFET; and
    (h) wherein the at least one EOS/ESD protection circuit has a first I-V characterization curve having a first snapback voltage, wherein at least one of the functional devices has a second I-V characterization curve having a second snapback voltage, and wherein the rectifying junction contact in the at least one EOS/ESD protection circuit causes the first snapback voltage to be less than the second snapback voltage.

2. The method of claim 1, wherein the MOSFET is a PMOS device.

3. The method of claim 1, wherein the MOSFET is an NMOS device.

4. The method of claim 1, further comprising a step of determining an amount of space, in the floor plan of the integrated circuit, required by the plurality of EOS/ESD protection circuits, wherein the step of designing the MOSFET is carried out to replace a MOSFET having a drain region and accompanying ohmic contact, and wherein the replacement of the MOSFET having a drain region and accompanying ohmic contact with a MOSFET having a rectifying junction contact is carried out to decrease the amount of space, in the floor plan of the integrated circuit, required by the plurality of EOS/ESD protection circuits.

5. A method of designing an integrated circuit with enhanced EOS/ESD robustness, comprising the steps of:
(a) designing a plurality of input/output pads in the integrated circuit;
(b) designing a positive voltage rail in the integrated circuit;
(c) designing a ground voltage rail in the integrated circuit;
(d) designing a collection of internal circuits, in the integrated circuit, representing the operational core of the integrated circuit;
(e) designing a plurality of input/output buffering circuits, in the integrated circuit, connected as inputs and outputs to the internal circuits, wherein the internal circuits and the input/output buffering circuits comprise functional devices; and
(f) designing a plurality of EOS/ESD protection circuits, in the integrated circuit, interconnected with the input/output pads to limit ESD voltage and/or shunt ESD current away from the functional devices, wherein at least one of the EOS/ESD protection circuits is a bipolar junction transistor (BJT);
(g) wherein designing the BJT includes designing an emitter region of the BJT to have an accompanying ohmic contact and designing the BJT to have a rectifying junction contact in place of a collector region and accompanying ohmic contact; and
(h) wherein the at least one EOS/ESD protection circuit has a first I-V characterization curve having a first snapback voltage, wherein at least one of the functional devices has a second I-V characterization curve having a second snapback voltage, and wherein the rectifying junction contact in the at least one EOS/ESD protection circuit causes the first snapback voltage to be less than the second snapback voltage.

6. The method of claim 5, further comprising a step of determining an amount of space, in the floor plan of the integrated circuit, required by the plurality of EOS/ESD protection circuits, wherein the step of designing the BJT is carried out to replace a BJT having a collector region and accompanying ohmic contact, and wherein the replacement of the BJT having a collector region and accompanying ohmic contact with a BJT having a rectifying junction contact is carried out to decrease the amount of space, in the floor plan of the integrated circuit, required by the plurality of EOS/ESD protection circuits.

7. A method of designing an integrated circuit with enhanced EOS/ESD robustness, comprising the steps of:
(a) designing a plurality of input/output pads in the integrated circuit;
(b) designing a positive voltage rail in the integrated circuit;
(c) designing a ground voltage rail in the integrated circuit;
(d) designing a collection of internal circuits, in the integrated circuit, representing the operational core of the integrated circuit;
(e) designing a plurality of input/output buffering circuits, in the integrated circuit, connected as inputs and outputs to the internal circuits, wherein the internal circuits and the input/output buffering circuits comprise functional devices, and wherein at least one of the functional devices is a MOSFET; and
(f) designing a plurality of EOS/ESD protection circuits, in the integrated circuit, interconnected with the input/output pads to limit ESD voltage and/or shunt ESD current away from the functional devices;
(g) wherein designing the MOSFET includes designing a drain region of the MOSFET to have an accompanying ohmic contact and designing the MOSFET to have a rectifying junction contact in place of a source region and accompanying ohmic contact of the MOSFET; and
(h) wherein the at least one functional device has a first I-V characterization curve having a first snapback current, wherein at least one of the EOS/ESD protection circuits has a second I-V characterization curve having a second snapback current, and wherein the rectifying junction contact in the at least one functional device causes the first snapback current to be greater than the second snapback current.

8. The method of claim 7, wherein the MOSFET is a PMOS device.

9. The method of claim 7, wherein the MOSFET is an NMOS device.

10. The method of claim 7, wherein the at least one functional device is an internal circuit.

11. The method of claim 7, wherein the at least one functional device is an input/output buffering circuit.

12. The method of claim 7, further comprising a step of determining an amount of space, in the floor plan of the integrated circuit, required by the plurality of EOS/ESD protection circuits, wherein the step of designing the MOSFET is carried out to replace a MOSFET having a source region and accompanying ohmic contact, and wherein the replacement of the MOSFET having a source region and accompanying ohmic contact with a MOSFET having a rectifying junction contact is carried out to avoid adding a further EOS/ESD protection circuit, thereby avoiding an increase in the amount of space, in the floor plan of the integrated circuit, required by the plurality of EOS/ESD protection circuits.

13. The method of claim 7, further comprising a step of designing a plurality of self-protected input/output buffering circuits, in the integrated circuit, connected as inputs and outputs to the internal circuits, that can also function as the EOS/ESD protection circuits.

14. A method of designing an integrated circuit with enhanced EOS/ESD robustness, comprising the steps of:
(a) designing a plurality of input/output pads in the integrated circuit;
(b) designing a positive voltage rail in the integrated circuit;
(c) designing a ground voltage rail in the integrated circuit;
(d) designing a collection of internal circuits, in the integrated circuit, representing the operational core of the integrated circuit;
(e) designing a plurality of input/output buffering circuits, in the integrated circuit, connected as inputs and outputs to the internal circuits, wherein the internal circuits and the input/output buffering circuits comprise functional devices, and wherein at least one of the functional devices includes a bipolar junction transistor (BJT); and
(f) designing a plurality of EOS/ESD protection circuits, in the integrated circuit, interconnected with the input/output pads to limit ESD voltage and/or shunt ESD current away from the functional devices;
(g) wherein designing the BJT includes designing a collector region of the BJT to have an accompanying ohmic contact and designing the BJT to have a rectifying junction contact in place of an emitter region and accompanying ohmic contact; and (h) wherein the at least one functional device has a first I-V characterization curve having a first snapback current, wherein at least one of the EOS/ESD protection circuits has a second I-V characterization curve having a second snapback current, and wherein the rectifying junction contact in the at least one functional device causes the first snapback current to be greater than the second snapback current.

15. The method of claim 14, wherein the at least one functional device is an internal circuit.

16. The method of claim 14, wherein the at least one functional device is an input/output buffering circuit.

17. The method of claim 14, further comprising a step of determining an amount of space, in the floor plan of the integrated circuit, required by the plurality of EOS/ESD protection circuits, wherein the step of designing the BJT is carried out to replace a BJT having an emitter region and accompanying ohmic contact, and wherein the replacement of the BJT having an emitter region and accompanying ohmic contact with a BJT having a rectifying junction contact is carried out to avoid adding a further EOS/ESD protection circuit, thereby avoiding an increase in the amount of space, in the floor plan of the integrated circuit, required by the plurality of EOS/ESD protection circuits.

\* \* \* \* \*